(12) United States Patent
Matsumoto et al.

(10) Patent No.: US 9,972,505 B2
(45) Date of Patent: May 15, 2018

(54) SEMICONDUCTOR DEVICE AND ITS MANUFACTURING METHOD

(71) Applicant: RENESAS ELECTRONICS CORPORATION, Tokyo (JP)

(72) Inventors: Masahiro Matsumoto, Ibaraki (JP); Kazuyoshi Maekawa, Ibaraki (JP); Yuichi Kawano, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days. days.

(21) Appl. No.: 14/943,900

(22) Filed: Nov. 17, 2015

(65) Prior Publication Data

US 2016/0181184 A1    Jun. 23, 2016

(30) Foreign Application Priority Data

Dec. 17, 2014   (JP) ................. 2014-255608

(51) Int. Cl.
*H01L 23/495*   (2006.01)
*H01L 21/48*    (2006.01)
(Continued)

(52) U.S. Cl.
CPC .... *H01L 21/4817* (2013.01); *H01L 21/76852* (2013.01); *H01L 23/53238* (2013.01);
(Continued)

(58) Field of Classification Search
CPC ......... H01L 24/05; H01L 24/06; H01L 24/48; H01L 24/03; H01L 24/10;
(Continued)

(56) References Cited

U.S. PATENT DOCUMENTS

| 7,235,844 B2 | 6/2007 | Itou |
| 8,710,659 B2 | 4/2014 | Moriyama et al. |

(Continued)

FOREIGN PATENT DOCUMENTS

| JP | H04242960 A | 8/1992 |
| JP | 2006-005325 A | 1/2006 |

(Continued)

OTHER PUBLICATIONS

Japanese Office Action issued in corresponding Japanese Patent Application No. 2014-255608, dated Mar. 6, 2018, with English Translation.

*Primary Examiner* — Ermias Woldegeorgis
(74) *Attorney, Agent, or Firm* — McDermott Will & Emery LLP

(57) ABSTRACT

The present invention makes it possible to improve the reliability of a semiconductor device. The semiconductor device has, over a semiconductor substrate, a pad electrode formed at the uppermost layer of a plurality of wiring layers, a surface protective film having an opening over the pad electrode, a redistribution line being formed over the surface protective film and having an upper surface and a side surface, a sidewall barrier film comprising an insulating film covering the side surface and exposing the upper surface of the redistribution line, and a cap metallic film covering the upper surface of the redistribution line. Then the upper surface and side surface of the redistribution line are covered with the cap metallic film or the sidewall barrier film and the cap metallic film and the sidewall barrier film have an overlapping section.

9 Claims, 23 Drawing Sheets

(51) Int. Cl.
*H01L 23/00* (2006.01)
*H01L 23/532* (2006.01)
*H01L 21/768* (2006.01)
*H01L 23/31* (2006.01)
*H01L 23/525* (2006.01)

(52) U.S. Cl.
CPC .............. *H01L 24/03* (2013.01); *H01L 24/05* (2013.01); *H01L 24/06* (2013.01); *H01L 23/3121* (2013.01); *H01L 23/525* (2013.01); *H01L 24/13* (2013.01); *H01L 24/45* (2013.01); *H01L 24/48* (2013.01); *H01L 2221/1078* (2013.01); *H01L 2224/02166* (2013.01); *H01L 2224/0345* (2013.01); *H01L 2224/03452* (2013.01); *H01L 2224/0401* (2013.01); *H01L 2224/04042* (2013.01); *H01L 2224/05075* (2013.01); *H01L 2224/05664* (2013.01); *H01L 2224/0612* (2013.01); *H01L 2224/131* (2013.01); *H01L 2224/45144* (2013.01); *H01L 2224/45147* (2013.01); *H01L 2224/45565* (2013.01); *H01L 2224/45644* (2013.01); *H01L 2224/45664* (2013.01); *H01L 2224/48247* (2013.01); *H01L 2224/48465* (2013.01); *H01L 2924/181* (2013.01)

(58) Field of Classification Search
CPC ........... H01L 23/49534; H01L 23/4952; H01L 23/49558; H01L 23/49579; H01L 21/4853; H01L 21/4857; H01L 21/4817; H01L 21/481
See application file for complete search history.

(56) References Cited

U.S. PATENT DOCUMENTS

| | | | |
|---|---|---|---|
| 9,627,344 B2 | 4/2017 | Kageyama et al. | |
| 2005/0121804 A1* | 6/2005 | Kuo | H01L 22/32 257/781 |
| 2008/0099919 A1 | 5/2008 | Ozawa | |
| 2011/0049705 A1* | 3/2011 | Liu | H01L 24/11 257/737 |
| 2011/0233761 A1* | 9/2011 | Hwang | H01L 24/03 257/737 |
| 2011/0298123 A1* | 12/2011 | Hwang | H01L 24/05 257/737 |

FOREIGN PATENT DOCUMENTS

| | | |
|---|---|---|
| JP | 2008-091454 A | 4/2008 |
| JP | 2008-091457 A | 4/2008 |
| JP | 2011-222963 A | 11/2011 |
| JP | 2012-119444 A | 6/2012 |
| JP | 2014-203958 A | 10/2014 |

* cited by examiner

SEMICONDUCTOR DEVICE AND ITS MANUFACTURING METHOD

CROSS-REFERENCE TO RELATED APPLICATIONS

The disclosure of Japanese Patent Application No. 2014-255608 filed on Dec. 17, 2014 including the specification, drawings and abstract is incorporated herein by reference in its entirety.

BACKGROUND

The present invention relates: to a semiconductor device and its manufacturing method; and in particular to a semiconductor device having a redistribution line comprising a metallic film above a plurality of wiring layers formed over the main surface of a semiconductor substrate and a technology effectively applicable to the manufacturing method of the semiconductor device.

In a semiconductor device, a multilayered wire (Cu wire or Al wire) comprising a metallic film containing Cu (copper) or Al (aluminum) as the main component for example is formed above a semiconductor substrate in which a semiconductor element such as a CMIS (Complementary Metal Insulator Semiconductor) transistor is formed for example and a final passivation film is formed above the multilayered wire.

In Japanese Unexamined Patent Application Publication No. Hei 4(1992)-242960 (Patent Literature 1), disclosed is a technology of forming a coated wire by differentiating a material for covering the upper part and lower part of a Cu wire from a material for covering the sidewall, namely by using materials having dry etching speeds different from each other, and by applying anisotropic etching without undergoing a photoresist process. Then in Example 1, disclosed is the example of forming an Mo/Cu/Mo three-layered film by sputtering, then forming a photoresist above the film (a), forming a pattern by ion milling or dry etching (b), successively forming an SiN film as a sidewall film (c), and successively manufacturing a coated Cu wire having a desired sidewall barrier by applying anisotropic etching by ion milling or dry etching.

CITATION LIST

Patent Literature

Patent Literature 1: Japanese Unexamined Patent Application Publication No. Hei 4(1992)-242960

SUMMARY

A semiconductor device (semiconductor integrated circuit device) having a redistribution line and being studied by the present inventors has a semiconductor chip, a wire coupled to the semiconductor chip, and a sealing body to seal the semiconductor chip and the wire. The semiconductor chip has a semiconductor element, a redistribution line containing Cu as the main component and being coupled electrically to the semiconductor element, and a wire comprised of a multilayered wiring layer and electrically coupling the semiconductor element to the redistribution line. The redistribution line is coupled to a pad electrode that is a part of a wire comprised of the uppermost wiring layer in the multilayered wiring layer. A surface protective film comprised of an inorganic insulating film to cover the wire comprised of the uppermost wiring layer electrically isolates the wire comprised of the uppermost wiring layer from the redistribution line, but the surface protective film has an opening so as to expose the pad electrode, and the redistribution line is coupled electrically to the pad electrode through the opening. The upper surface and side surface of the redistribution line are covered with an organic protective film, but the organic protective film has an opening to expose an external pad electrode formed at the upper surface of the redistribution line, and the wire is coupled to the redistribution line through the opening with a nickel (Ni) plating film and a gold (Au) plating film interposed.

In the semiconductor chip, a plurality of redistribution lines are formed, the minimum wire width of the redistribution lines is 12 μm, and the minimum interval between the adjacent redistribution lines is 15 μm. A seed layer comprised of a metallic film (Cr film for example) for forming the redistribution lines by a plating method is formed over the lower surfaces of the redistribution lines but the upper surfaces and side surfaces of the redistribution lines are in contact with the organic protective film.

A semiconductor device studied by the present inventors is required to have a high withstand voltage and a high reliability and hence an operation test in a high-temperature high-humidity atmosphere, called an HAST (Highly Accelerated temperature and humidity Stress Test) is applied. As a result of the studies by the present inventors, it has been found in the HAST that Cu precipitates dendritically from one redistribution line between adjacent redistribution lines, withstand voltage deterioration or short circuit is caused between adjacent redistribution lines, and the reliability of the semiconductor device lowers. Then it has been also found that the dendritic precipitation of Cu appears at the interface between the surface protective film and the organic protective film.

According to the analysis by the present inventors, the organic protective film covering the redistribution lines comprised of Cu comprises a polyimide film and contains moisture and halogen ions and hence the surface of Cu configuring the redistribution lines is oxidized and resultantly Cu ions (ionized Cu) are generated. Further, moisture and halogen ions are contained also in an epoxy resin to seal the semiconductor chip. It has been found that, in such a semiconductor device, although the minimum interval (15 μm) between adjacent redistribution lines is large, a region where a high voltage is applied and a high electric field is formed between adjacent redistribution lines exists and the dendritic precipitation of Cu occurs in the region. That is, it is estimated that Cu ions migrate (diffuse) at the interface between the surface protective film and the organic protective film by the influence of the high electric field, hence withstand voltage deterioration or short circuit is caused between adjacent redistribution lines, and the reliability of the semiconductor device lowers.

An object of the present invention is to provide a technology that can improve reliability in a semiconductor device having a redistribution line.

The aforementioned and other objects and the novel features of the present invention will be obvious from the descriptions and attached drawings in the present specification.

A semiconductor device according to an embodiment has a pad electrode formed at the uppermost layer in a plurality of wiring layers, a surface protective film having an opening over the pad electrode, a redistribution line being formed over the surface protective film and having an upper surface and a side surface, a sidewall barrier film comprised of an insulating film exposing the upper surface of the redistribution line and covering the side surface, and a cap metallic film covering the upper surface of the redistribution line. Then the upper surface and side surface of the redistribution line are covered with the cap metallic film or the sidewall barrier film, and the cap metallic film and the sidewall barrier film have parts overlapping with each other.

According to an embodiment, it is possible to improve the reliability of a semiconductor device having a redistribution line.

DETAILED DESCRIPTION

Figure 1:
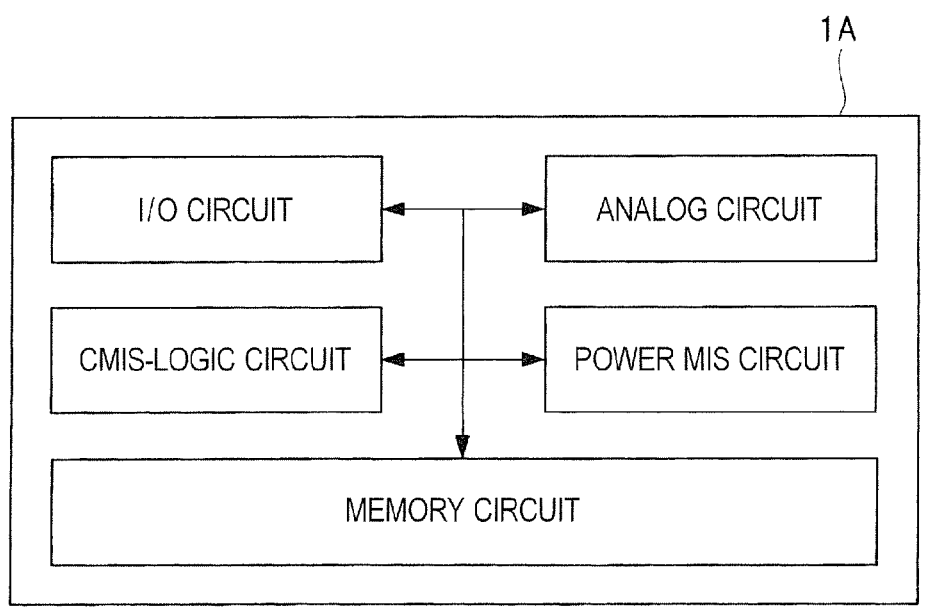
FIG. 1 is a circuit block diagram of a semiconductor device according to Embodiment 1.

In the following embodiments, if necessary for convenience sake, each of the embodiments is explained by dividing it into plural sections or embodiments but, unless otherwise specified, they are not unrelated to each other and are in the relationship of one being a modified example, an application example, a detailed explanation, a supplemental explanation, or the like of a part or the whole of another. Further in the following embodiments, when the number of elements and others (including the number of pieces, a numerical value, a quantity, a range, and others) are referred to, except the cases of being specified and being limited obviously to a specific number in principle and other cases, the number is not limited to a specific number and may be larger or smaller than the specific number.

Further in the following embodiments, the constituent components (including a component step and others) are not necessarily essential except the cases of being specified and being obviously thought to be essential in principle and other cases. Likewise in the following embodiments, when a shape, positional relationship, and the like of a constituent component or the like are referred to, they substantially include those approximate or similar to the shape and the like except the cases of being specified and being obviously thought to be otherwise in principle and other cases. The same goes for the number and others (including the number of pieces, a numerical value, a quantity, a range, and others).

The embodiments according to the present invention are hereunder explained in detail in reference to the drawings. Here, in all the drawings for explaining the embodiments, members having an identical function are represented with an identical or related code and are not explained repeatedly. Further, when a plurality of similar members (sites) exist, an individual or specific site may occasionally be shown by adding a sign to a generic code. Furthermore, in the following embodiments, except when particularly needed, an identical or similar part is not explained repeatedly in principle.

Further, in the drawings used in the embodiments, hatching may sometimes be avoided even in a sectional view in order to make a drawing more visible. In contrast, hatching may sometimes be used even in a plan view in order to make a drawing more visible.

Further, in the sectional views and the plan views, the size of a site may not correspond to an actual device and a specific site may be represented in a relatively enlarged manner in some cases in order to make a drawing easy to understand. Furthermore, even in the case where a plan view and a sectional view correspond to each other, the size of a site may sometimes be shown in different sizes.

(Embodiment 1)

A semiconductor device (semiconductor integrated circuit device) according to Embodiment 1 or one of the following embodiments for example: has a semiconductor chip having a plurality of semiconductor elements, a wire of a multilayer (multilayered wire) formed above the semiconductor elements, and a plurality of redistribution lines coupled to the wire of the uppermost layer in the multilayer; and is configured by coupling the semiconductor elements to each other through the multilayered wire and the redistribution lines.

<With Regard to Semiconductor Device>

FIG. 1 is a circuit block diagram of a semiconductor device. As shown in FIG. 1, the semiconductor device is configured for example by having an input/output (I/O) circuit, an analog circuit, a CMIS-logic circuit, a power MIS circuit, and a memory circuit, those being formed over the device face of a semiconductor chip 1A.

In the circuits configuring the semiconductor device, the CMIS-logic circuit comprises a CMIS transistor of an operating voltage of 1 to 3 V for example and the I/O circuit and the memory circuit comprise CMIS transistors of operating voltages of 1 to 3 V and 5 to 8 V respectively for example.

A CMIS transistor of an operating voltage of 1 to 3 V comprises a first n-channel type MISFET (Metal Insulator Semiconductor Field Effect Transistor) having a first gate insulating film and a first p-channel type MISFET having the first gate insulating film. Further, a CMIS transistor of an operating voltage of 5 to 8 V comprises a second n-channel type MISFET having a second gate insulating film and a second p-channel type MISFET having the second gate insulating film. The film thickness of the second gate insulating film is set so as to be larger than the film thickness of the first gate insulating film. In the following explanations, a MISFET is called a MIS transistor.

Further, the analog circuit comprises a CMIS transistor (or bipolar transistor) of an operating voltage of 5 to 8 V, a resistive element, and a capacitive element for example and the power MIS circuit comprises a CMIS transistor of an operating voltage of 5 to 8 V and a high-voltage MIS transistor (high-voltage element) of an operating voltage of 20 to 100 V for example.

The high-voltage MIS transistor comprises a third n-channel type MISFET having a third gate insulating film, a third p-channel type MISFET having the third gate insulating film, or both the MISFETs for example. When a voltage of 20 to 100 V is applied between a gate electrode and a drain region or between the gate electrode and a source region, the film thickness of the third gate insulating film is set so as to be larger than the film thickness of the second gate insulating film.

Figure 2:
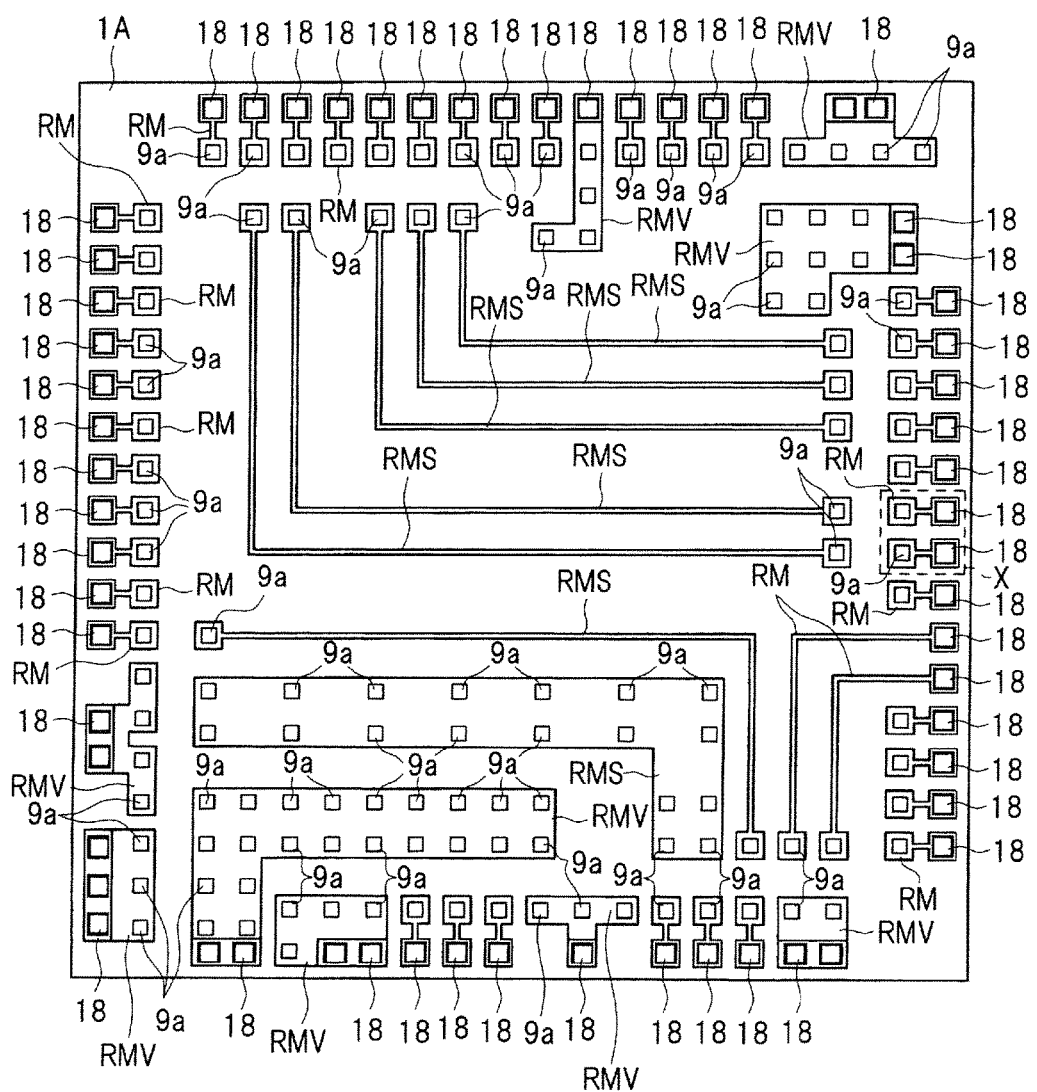
FIG. 2 is a general plan view of a semiconductor chip configuring a semiconductor device according to Embodiment 1.
Figure 3:
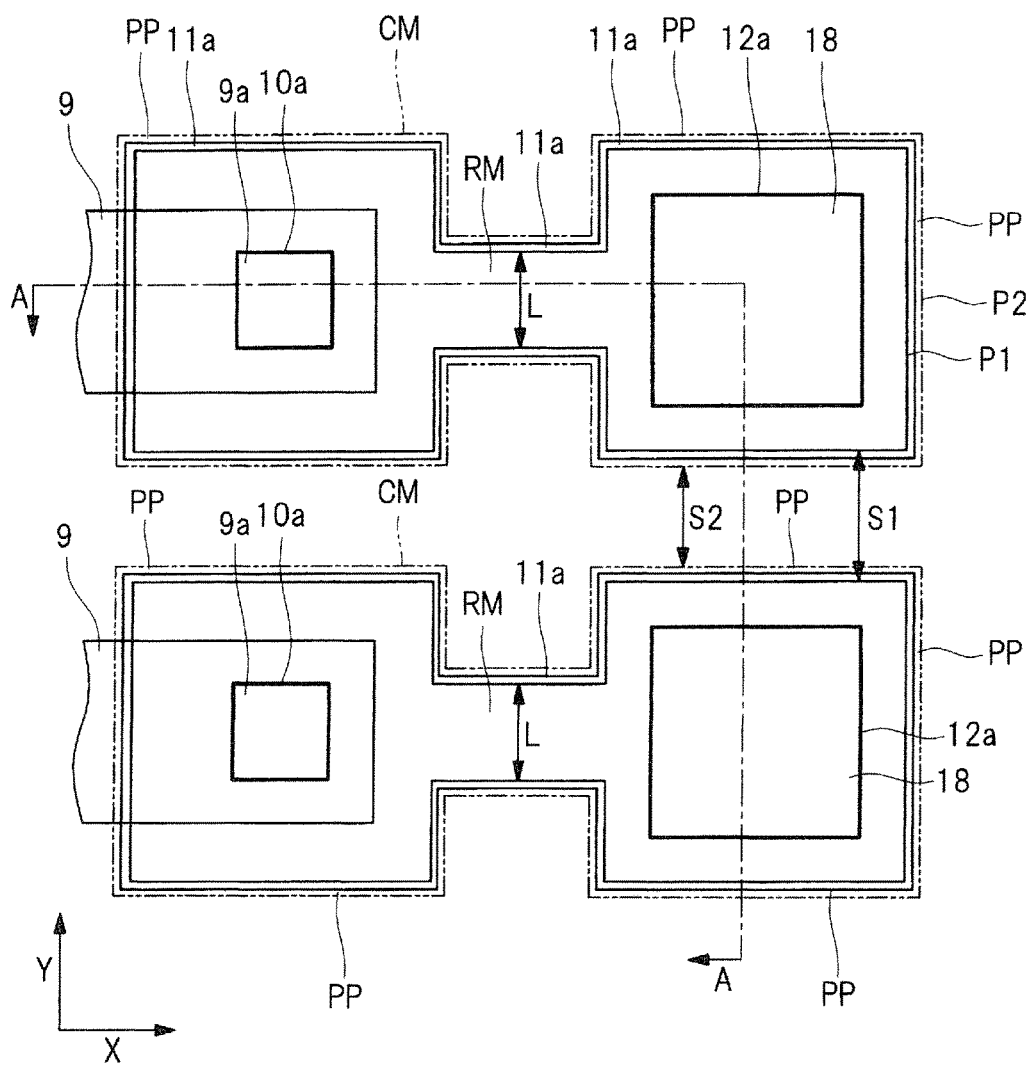
FIG. 3 is a plan view enlargedly showing a part of FIG. 2.
Figure 4:
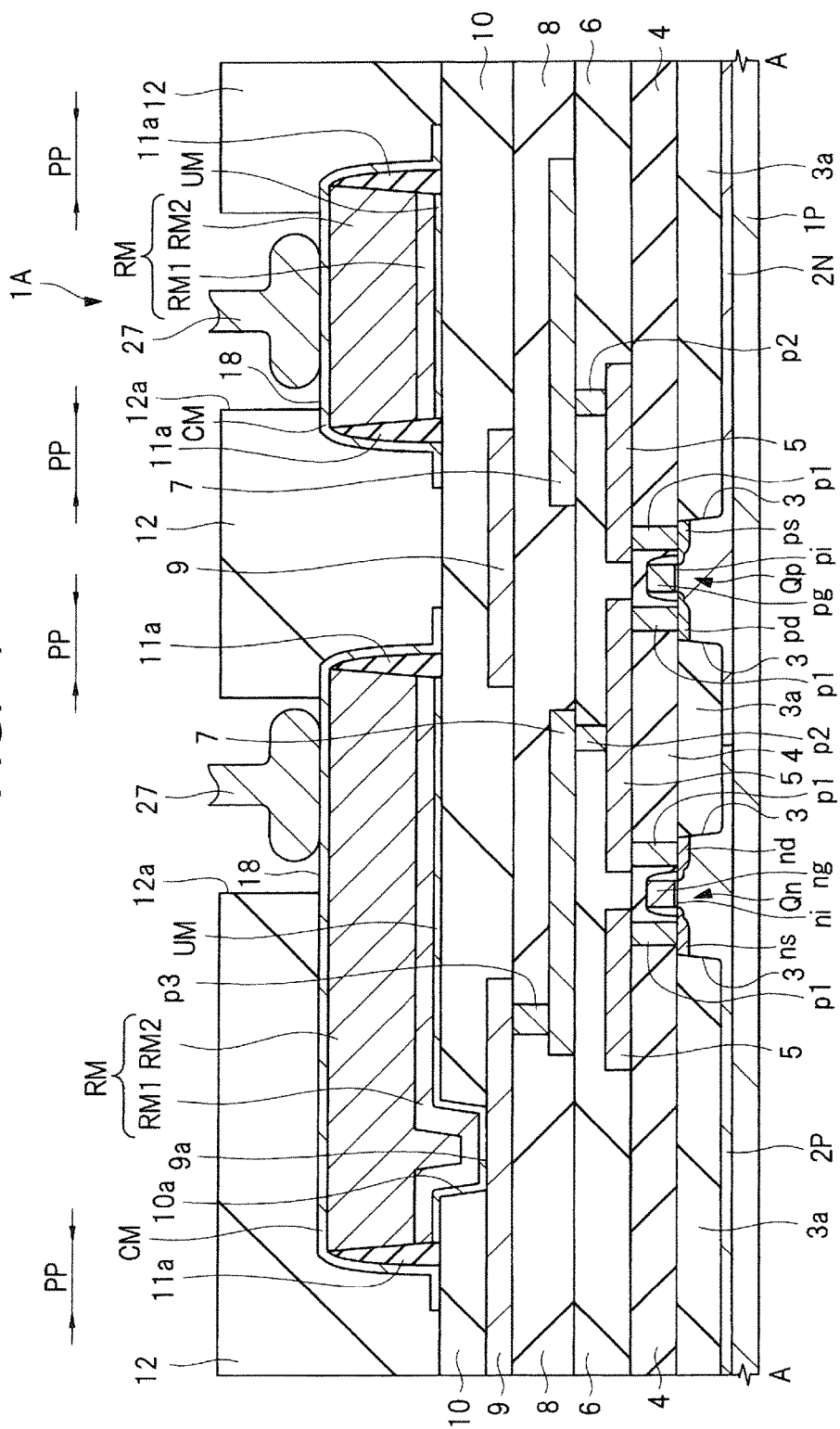
FIG. 4 is a sectional view taken on line A-A of FIG. 3.

FIG. 2 is a general plan view of the semiconductor chip 1A, FIG. 3 is an enlarged plan view of the region surrounded by the broken line X of FIG. 2, and FIG. 4 is a sectional view taken on line A-A of FIG. 3.

FIG. 2 shows an example of a layout of redistribution lines RM, RMV, and RMS formed over the device face of the semiconductor chip 1A. Both the film thickness and the wiring width of each of the redistribution lines RM, RMV, and RMS are larger than those of the multilayered wire (a first layered Al wire 5, a second layered Al wire 7, and a third layered Al wire 9 shown in FIG. 4) of the semiconductor chip 1A and hence each of the redistribution lines RM, RMV, and RMS has a very low impedance in comparison with the multilayered wire. The redistribution lines RM, RMV, and RMS are used as the redistribution lines RM for inputting and outputting a signal, the redistribution lines RMV for supplying electric power supply (Vcc, GND), and the redistribution lines RMS for coupling internal circuits to each other for example.

As shown in FIG. 2, the redistribution lines RM configuring the external connection terminals of the semiconductor device are arranged at the peripheral part of the semiconductor chip 1A. An external pad electrode 18 is formed at an end of each of the redistribution lines RM configuring the external connection terminals of the semiconductor device and the other end is coupled to a pad electrode 9a formed at the wire of the uppermost layer as shown in FIGS. 3 and 4. The external pad electrodes 18 are not particularly limited but are arranged in a row along the sides of the semiconductor chip 1A. It is a matter of course here that the external pad electrodes 18 may also be arranged zigzag or so as to form three or more rows along the sides of the semiconductor chip 1A. That is, the redistribution lines RM are redistribution lines for inputting and outputting a signal that configure the input/output (I/O) circuit in FIG. 1 for example.

Further, the redistribution lines RMV shown in FIG. 2 are redistribution lines for supplying electric power supply (Vcc, GND). An external pad electrode 18 is formed at an end of each of the redistribution lines RMV and the other end is coupled to a pad electrode 9a formed at an electric power supply wire in the semiconductor chip 1A and hence it is possible to supply the electric power supply (Vcc, GND) voltage supplied from the exterior of the semiconductor chip 1A to the electric power supply wires in the semiconductor chip 1A at a low impedance.

Further, the redistribution lines RMS shown in FIG. 2 are used as wires to couple circuits or elements, those being formed in the semiconductor chip 1A, to each other. No external pad electrodes 18 therefore are formed at the redistribution lines RMS. Both the ends of each of the redistribution lines RMS are coupled to the pad electrodes 9a formed in each of the wires.

FIG. 3 shows an enlarged plan view of adjacent two redistribution lines RM for inputting and outputting a signal. The adjacent two redistribution lines RM have an identical planar shape and hence the explanations are made on the basis of the redistribution line RM located at the upper part of the figure. The redistribution line RM extends in the X direction in the figure and an end of the redistribution line RM is electrically coupled to a pad electrode 9a of a wire 9 extending in the X direction in the figure. An external pad electrode 18 is formed at the other end of the redistribution line RM. The redistribution line RM has a first plane pattern P1 and a cap metallic film CM has a second plane pattern P2. The first plane pattern P1 and the second plane pattern P2 are similarly shaped and the second plane pattern P2 has a shape formed by enlarging the first plane pattern P1. A flared section PP comprising the cap metallic film CM is arranged around the whole circumference of the redistribution line RM. That is, the second plane pattern P2 is obtained by expanding the first plane pattern P1 to the extent corresponding to the width of the flared section PP. Further, a sidewall barrier film 11a is arranged on the outside of the redistribution line around the whole circumference of the redistribution line RM. The sidewall barrier film 11a is in contact with the side surface of the redistribution line RM. The width of the sidewall barrier film 11a is smaller than the width of the flared section PP.

Further, the minimum wiring width L of the redistribution line RM is 12 µm, the minimum wiring interval S1 between adjacent redistribution lines RM is 15 µm, the minimum interval S2 between adjacent flared sections PP is 10 µm, and the flare length of the flared section PP is 2.5 µm for example.

As shown in FIG. 4, a p-type well (p-type well region) 2P, an n-type well (n-type well region) 2N, and an element isolation trench 3 are formed over a semiconductor substrate 1P comprised of a p-type monocrystal silicon for example and an element isolation insulating film 3a comprised of a silicon oxide film is embedded into the interior of the element isolation trench 3 for example.

An n-channel type MIS transistor (Qn) that is a semiconductor element is formed in the p-type well 2P. The n-channel type MIS transistor (Qn) is formed in an active region defined by the element isolation trench 3 and has a source region ns and a drain region nd, those being formed in the p-type well 2P, and a gate electrode ng formed over the p-type well 2P with a gate insulating film ni interposed. Further, a p-channel type MIS transistor (Qp) that is a semiconductor element is formed in the n-type well 2N and has a source region ps, a drain region pd, and a gate electrode pg formed over the n-type well 2N with a gate insulating film pi interposed.

A wire comprising a metallic film to couple the semiconductor elements to each other is formed above the n-channel type MIS transistor (Qn) and the p-channel type MIS transistor (Qp). The wire to couple semiconductor elements to each other generally has a multilayered wiring structure of about three to ten layers and, as an example of a multilayered wire, a three-layered wiring layer (a first layered Al wire 5, a second layered Al wire 7, and a third layered Al wire 9) comprising a metallic film mainly comprising an Al alloy is shown in FIG. 4. The term "wiring layer" is used when a plurality of wires comprising respective wiring layers are represented collectively. With regard to the film thickness of a wiring layer, the film thickness of the second wiring layer is larger than that of the first wiring layer and the film thickness of the third wiring layer is larger than that of the second wiring layer.

Interlayer insulating films 4, 6, and 8, each comprising a silicon oxide film or the like, and plugs p1, p2, and p3 electrically coupling the three wiring layers to each other are formed between the n-channel type MIS transistor (Qn)/the p-channel type MIS transistor (Qp) and the first layered Al wire 5, between the first layered Al wire 5 and the second layered Al wire 7, and between the second layered Al wire 7 and the third layered Al wire 9, respectively.

The interlayer insulating film 4 is formed over the semiconductor substrate 1P in the manner of covering the semiconductor elements and the first layered Al wire 5 is formed over the interlayer insulating film 4 for example. The first layered Al wire 5 is electrically coupled to the source region ns, the drain region nd, and the gate electrode ng of the n-channel type MIS transistor (Qn) that is a semiconductor element with the plug p1 formed in the interlayer insulating film 4 interposed for example. Further, the first layered Al wire 5 is electrically coupled to the source region ps, the drain region pd, and the gate electrode pg of the p-channel type MIS transistor (Qp) that is a semiconductor element with the plug p1 formed in the interlayer insulating film 4 interposed. The connection between the gate electrodes ng and pg and the first layered Al wire 5 is not shown in the figure.

The second layered Al wire 7 is electrically coupled to the first layered Al wire 5 with the plugs p2 formed in the interlayer insulating film 6 interposed for example. The third layered Al wire 9 is electrically coupled to the second layered Al wire 7 with the plug p3 formed in the interlayer insulating film 8 interposed for example. Each of the plugs p1, p2, and p3 is comprised of a metallic film, for example a W (tungsten) film.

Here, it goes without saying that, when a multilayered wire (three-layered wire) is formed with metallic films mainly comprising Cu by a chemical mechanical polishing method (CMP method), it may be formed by a dual damascene method of forming a wire and a plug integrally. Further, it goes without saying that each of the interlayer insulating films 4, 6, and 8 comprises a silicon oxide ($SiO_2$) film but may comprise a single-layered film or a laminated film of a silicon oxide film containing carbon (SiOC film), a silicon oxide film containing nitrogen and carbon (SiCON film), or a silicon oxide film containing fluorine (SiOF film).

A surface protective film (protective film or insulating film) 10 comprising a single-layered film of a silicon oxide ($SiO_2$ or TEOS (Tetraethyl orthosilicate)) film or a silicon nitride (SiN) film or a double-layered film formed by stacking them is formed as a final passivation film above the third layered Al wire 9 that is the uppermost wiring layer in the multilayered wire for example. Preferably a double-layered structure formed by stacking a silicon nitride film over a silicon oxide film is used and the total film thickness of them is set at 0.3 to 1 µm. Then the third layered Al wire 9 that is the uppermost wiring layer exposed at the bottom part of a pad opening (opening) 10a formed in the surface protective film 10 configures a pad electrode (electrode pad or first electrode pad) 9a that is an Al pad.

The third layered Al wire 9 comprises not only the pad electrode 9a but also a wire formed integrally with the pad electrode 9a and a wire not coupled to the pad electrode 9a for example. The wire not coupled to the pad electrode 9a electrically couples semiconductor elements or circuits to each other and is used as a wire configuring a semiconductor integrated circuit.

A redistribution line RM is formed in the interior of the pad opening 10a so as to completely fill the pad opening 10a and further extends over the surface protective film 10.

A base metallic film UM is interposed between the pad electrode 9a and the redistribution line RM. The base metallic film UM: is in contact with and is electrically coupled to the pad electrode 9a: is formed over the pad electrode 9a and along the side surface (sidewall) of the surface protective film 10 at the pad opening 10a of the surface protective film 10; and further extends over the upper surface of the surface protective film 10. The base metallic film UM has an upper surface, a lower surface, and a side surface. The upper surface is in contact with the redistribution line RM, the lower surface is in contact with the pad electrode 9a and the surface protective film 10, and the side surface is in contact with a sidewall barrier film 11a that will be described later. As it will be described later, the base metallic film UM comprises a base barrier film of a three-layered structure and comprises a first base barrier film UM1, a second base barrier film UM2, and a third base barrier film UM3 in sequence from the side of the pad electrode 9a. The upper surface of the base metallic film UM therefore means the upper surface of the third base barrier film UM3 and the lower surface means the lower surface of the first base barrier film UM1. The base metallic film UM has the diffusion barrier function of preventing copper (Cu) configuring the redistribution line RM from diffusing into the surface protective film 10 and the like and the moisture absorption barrier function of preventing moisture and the like from intruding into the redistribution line RM from the exterior. The base metallic film UM is comprised of a titanium (Ti) film, a titanium nitride (TiN) film, a tantalum (Ta) film, a tantalum nitride (TaN) film, a tungsten (W) film, a tungsten nitride (WN) film, a chromium (Cr) film, or the like and the total film thickness of the base metallic film UM is preferably 50 to 300 nm. Here for example, the first base barrier film UM1, the second base barrier film UM2, and the third base barrier film UM3 comprise a titanium (Ti) film, a titanium nitride (TiN) film, and a titanium (Ti) film respectively in sequence and the film thicknesses of them are set at 10 nm, 50 nm, and 10 nm respectively in sequence. The film thicknesses are the film thicknesses over the upper surface of the surface protective film 10. The base metallic film UM may comprise a single layer.

Further, the redistribution line RM has an upper surface, a lower surface, and a side surface and the lower surface of the redistribution line RM is in contact with the upper surface of the base metallic film UM. The redistribution line RM is a copper film containing copper (Cu) as the main component but may contain an additive such as Al. The redistribution line RM is comprised of a laminated structure of a seed film RM1 and a plating film RM2. The lower surface of the redistribution line RM therefore means the lower surface of the seed film RM1 and the upper surface means the upper surface of the plating film RM2. Further, the side surface (sidewall) of the redistribution line RM means the side surface (sidewall) of the laminated structure of the seed film RM1 and the plating film RM2. The film thickness of the seed film RM1 is set at 50 to 300 nm and the film thickness of the plating film RM2 is 5 to 20 µm. Incidentally, the film thickness of the third layered Al wire 9 is 400 to 600 nm and hence the redistribution line RM is a low-resistance wire having a film thickness not less than ten times the thickness of the third layered Al wire 9, in other words the wire 9 in which the pad electrode 9a is formed. That is, the film thickness of the redistribution line RM is larger than the film thickness of the wire 9 in which the pad electrode 9a is formed and desirably is not less than ten times the film thickness of the wire 9 in which the pad electrode 9a is formed. The redistribution line RM takes an inverted trapezoidal shape in which the width of the upper surface is larger than the width of the lower surface in a sectional view. The side surface of the redistribution line RM therefore has a tapered shape in which the width of the redistribution line RM reduces from the upper surface toward the lower surface and that is called an inverse taper. Inversely, when the sectional shape of the redistribution line RM is a trapezoidal shape, namely when the side surface of the redistribution line RM has a tapered shape in which the width of the redistribution line RM increases from the upper surface toward the lower surface, that is called a forward taper.

The sidewall barrier film 11a is formed so as to cover the side surface of the redistribution line RM. The sidewall barrier film 11a is formed continuously from the upper surface to the lower surface of the redistribution line RM along the side surface of the redistribution line RM and covers the side surface of the redistribution line RM over the whole circumference of the redistribution line RM. The sidewall barrier film 11a is in contact with the side surface of the redistribution line RM.

The sidewall barrier film 11a has the effect of improving the inverse taper of the redistribution line RM (inverse taper improving function). That is, the side surface of the integral structure of the redistribution line RM and the sidewall barrier film 11a is forwardly tapered, hence the coverability of a film formed over the sidewall barrier film 11a improves, and it is possible to reduce the generation of a break (a crack, a discontinuous part). It is not necessarily to make the side surface of the integral structure have a forward taper however and it is vital to alleviate the inverse taper of the redistribution line RM toward the side of the forward taper. The sidewall barrier film 11a has a nearly triangular shape in a sectional view and the width of the sidewall barrier film 11a increases gradually from the upper surface toward the lower surface of the redistribution line RM. The top end of the sidewall barrier film 11a should ideally coincide with the upper surface of the redistribution line RM but may also be lower than the upper surface.

Further, the sidewall barrier film 11a may have the moisture absorption barrier function of preventing moisture and the like from intruding into the redistribution line RM and the diffusion barrier function of preventing copper (Cu) configuring the redistribution line RM from migrating (diffusing) to the exterior. As the sidewall barrier film 11a, a silicon oxide film or a silicon nitride film formed by a CVD (Chemical Vapor Deposition) method can be used and the film thickness (width) may preferably be 0.1 to 3 µm. The silicon nitride film has the inverse taper improving (reducing) function, the moisture absorption barrier function, and the diffusion barrier function. In contrast, the silicon oxide film has the inverse taper improving function but does not have the moisture absorption barrier function and the diffusion barrier function. The structure (shape) required of the cap metallic film CM therefor is different between the case of using the silicon oxide film and the case of using the silicon nitride film as the sidewall barrier film 11a.

For example, since the bottom end (lower surface) of the sidewall barrier film 11a is in contact with the side surface of the base metallic film UM and covers the redistribution line RM and the base metallic film UM, in the case of the sidewall barrier film 11a comprising the silicon nitride film, it is possible to further improve the diffusion barrier function and the moisture absorption barrier function by both the sidewall barrier film 11a and the base metallic film UM. Further, since the sidewall barrier film 11a is in contact with the surface protective film 10, when the sidewall barrier film 11a and the surface protective film 10 comprise the silicon nitride films respectively, a robust adhesiveness is obtained at the contact site of the sidewall barrier film 11a and the surface protective film 10 and the diffusion barrier function and the moisture absorption barrier function can be improved further.

A cap metallic film CM is formed so as to be in contact with the top surface of the redistribution line RM and the sidewall barrier film 11a and cover the redistribution line RM. The cap metallic film CM covers the whole upper surface and the whole side surface of the redistribution line RM. The cap metallic film CM completely covers the side surface (sidewall) of the seed film RM1 and the side surface (sidewall) of the plating film RM2, those configuring the redistribution line RM. The cap metallic film CM has an upper surface and a lower surface and the lower surface is in contact with the upper surface of the redistribution line RM and the sidewall barrier film 11a and, in the region outside the redistribution line RM (region where the redistribution line RM is not formed), is in contact with the surface protective film 10. In a plan view, the cap metallic film CM has a flared section PP from the side surface of the redistribution line RM (strictly, the bottom end part of the side surface of the redistribution line RM) to the region outside the redistribution line RM (region where the redistribution line RM is not formed) and, at the flared section PP, the upper surface of the surface protective film 10 and the lower surface of the cap metallic film CM are in contact with each other. That is, in a plan view, the end of the cap metallic film CM that is the tip of the flared section PP is located on the remoter side of the cap metallic film CM formed over the side surface (sidewall) of the redistribution line RM from the redistribution line RM. Further, the flared section PP is formed over the whole circumference of the redistribution line RM in a plan view.

As it will be described later, the cap metallic film CM is comprised of a laminated structure of a first cap barrier film CM1 and a second cap barrier film CM2 and the lower surface of the first cap barrier film CM1 is in contact with the upper surface of the redistribution line RM and the sidewall barrier film 11a. The first cap barrier film CM1 is a barrier film having the moisture absorption barrier function of preventing moisture and the like from intruding into the redistribution line RM or the diffusion barrier function of preventing copper (Cu) configuring the redistribution line RM from migrating (diffusing) to the exterior and the second cap barrier film CM2 is an adhesive film for improving adhesiveness with a wire 27 as it will be described later. As the first cap barrier film CM1, a titanium (Ti) film, a tantalum (Ta) film, a tungsten (W) film, a nickel (Ni) film, or a nitride film of any one of them, those being formed by a sputtering method, is suitable. Further, as the second cap barrier film CM2, a palladium (Pd) film, a gold (Au) film, a platinum (Pt) film, a ruthenium (Ru) film, an iridium (Ir) film, or a rhodium (Rh) film, those being formed by a sputtering method, is suitable.

In Embodiment 1, the first cap barrier film CM1 is comprised of a titanium (Ti) film formed by a sputtering method and the film thickness is 50 nm and the second cap barrier film CM2 is comprised of a palladium (Pd) film formed by a sputtering method and the film thickness is 175 nm. The film thicknesses are the film thicknesses over the upper surface of the redistribution line RM.

Further, since the sidewall barrier film 11a is formed over the side surface of the redistribution line RM, the first cap barrier film CM1 and the second cap barrier film CM2, those being formed by a sputtering method, are formed from the upper surface along the side surface of the redistribution line RM to above the surface protective film 10 continuously without a break (a crack, a discontinuous part). If the sidewall barrier film 11a does not exist, a break may possibly occur in the first cap barrier film CM1 and the second cap barrier film CM2, those being formed by a sputtering method, in the thickness direction of the redistribution line RM, in other words, at the side surface of the redistribution line RM. That is, for example, because the coverability of a film formed by a sputtering method is low in comparison with a film formed by a CVD method, the film thickness of the redistribution line RM is very large, and further the side surface of the redistribution line RM is inversely tapered, the possibility of generating a break in the first cap barrier film CM1 and the second cap barrier film CM2 increases. In Embodiment 1, since the sidewall barrier film 11a is formed over the side surface of the redistribution line RM, it is possible to prevent the first cap barrier film CM1 and the second cap barrier film CM2, those being formed by a sputtering method, from breaking.

In this way, by forming the cap metallic film CM (concretely the first cap barrier film) so as to completely cover the upper surface of the redistribution line RM and the sidewall barrier film 11a, the upper surface and side surface of the redistribution line RM are completely covered with the cap metallic film CM having the barrier function against moisture or copper (CU) without a break. It is therefore possible to prevent moisture, halogen ions, and others from intruding into the redistribution line RM from the exterior of the redistribution line RM. Further, it is possible to prevent copper (Cu) configuring the redistribution line RM from ionizing and migrating (diffusing) to the exterior of the redistribution line RM. In this way, when the structure of completely covering the upper surface and side surface of the redistribution line RM with the cap metallic film CM having the barrier function is adopted, the sidewall barrier film 11a is only required to have an inverse taper improving function and hence not only a silicon nitride film but also a silicon oxide film can be used. Further, when a silicon nitride film is used as the sidewall barrier film 11a, it is vital that the cap metallic film CM completely covers the upper surface of the redistribution line RM, extends continuously from the upper surface of the redistribution line RM over the sidewall barrier film 11a, and partially overlaps with the sidewall barrier film 11a (has an overlapping part). In other words, the cap metallic film CM is only required to cover the end part of the sidewall barrier film 11a located on the upper surface side of the redistribution line RM. In other words further, the cap metallic film CM completely covering the upper surface of the redistribution line RM is not necessarily required to reach the upper surface of the surface protective film 10 continuously and may be enough as long as it covers the interface where the redistribution line RM and the sidewall barrier film 11a are in contact with each other.

Further, when the top end of the sidewall barrier film 11a is lower than the upper surface of the redistribution line RM as stated earlier, since a part of the side surface of the redistribution line RM is exposed from the sidewall barrier film 11a in the structure, it is vital to form the structure of: extending the cap metallic film CM covering the upper surface of the redistribution line RM up to the sidewall of the redistribution line RM continuously; covering the side surface of the redistribution line RM exposed from the sidewall barrier film 11a; and further overlapping with the sidewall barrier film 11a. Here, when the sidewall barrier film 11a is comprised of a silicon oxide film, the cap metallic film CM has to reach the upper surface of the surface protective film 10 from the upper surface of the redistribution line RM. When the sidewall barrier film 11a is comprised of a silicon nitride film, only required is the structure in which the cap metallic film CM overlaps with the sidewall barrier film 11a as stated above.

A protective film 12 is formed so as to cover the upper surface and side surface of the redistribution line RM. The protective film 12 has an opening 12a to partially expose the upper surface of the redistribution line RM (accurately the upper surface of the cap metallic film CM, namely the upper surface of the second cap barrier film CM2) and the exposed part of the redistribution line RM configures an external pad electrode 18. The protective film 12 is comprised of an organic film, for example a film of a polyimide based resin, a benzocyclobutene based resin, an acryl based resin, an epoxy based resin, or a silicon based resin.

A wire 27 comprising copper (Cu) is coupled (by wire bonding or bonding) to the external pad electrode 18 for example. The wire 27 comprising copper forms an alloy with a palladium film that is the second barrier film CM2 in the cap metallic film CM.

Here, the base metallic film UM and the cap metallic film CM prevent the copper (Cu) film configuring the redistribution line RM from becoming copper ions and migrating (diffusing) to the exterior and comprise materials (different materials) different from the redistribution line RM. Further, the base metallic film UM and the cap metallic film CM do not contain a copper (Cu) film.

Further, although explanations have been made on the basis of the redistribution line RM for inputting and outputting a signal, a redistribution line RMV for supplying an electric power and a redistribution line RMS for coupling circuits or elements to each other have also structures similar to the redistribution line RM, respectively. In a redistribution line RMS however, an external pad electrode 18 is not formed and a wire 27 is not coupled. The upper surface of the redistribution line RMS is wholly covered with the protective film 12.

<Feature of Semiconductor Device>

Major features of a semiconductor device according to Embodiment 1 are explained hereunder.

The redistribution line RM comprising a copper film is formed over the base metallic film UM and has the upper surface and the side surface. The upper surface of the redistribution line RM is covered with the cap metallic film CM having the diffusion barrier function or the moisture absorption barrier function and the side surface of the redistribution line RM is covered with the cap metallic film CM with the sidewall barrier film 11a interposed. By forming the cap metallic film CM so as to override the sidewall barrier film 11a, it is possible to: form the cap metallic film CM without a break; and improve the diffusion barrier function and the moisture absorption barrier function of the cap metallic film CM. It is therefore possible to: prevent withstand voltage deterioration or short circuit between adjacent redistribution lines RM; and improve the reliability of the semiconductor device having the redistribution line.

Even when the side surface of the redistribution line RM is inversely tapered, it is possible to form the cap metallic film CM without a break by forming the sidewall barrier film 11a.

The redistribution line RM comprising a copper film is formed over the base metallic film UM and has the upper surface and the side surface. The upper surface of the redistribution line RM is covered with the cap metallic film CM having the diffusion barrier function or the moisture absorption barrier function and the side surface of the redistribution line RM is covered with the sidewall barrier film 11a having the diffusion barrier function or the moisture absorption barrier function. Then the cap metallic film CM covering the upper surface of the redistribution line RM extends over the side surface of the redistribution line RM and overrides the sidewall barrier film 11a. That is, the end part of the sidewall barrier film 11a on the upper surface side of the redistribution line RM is covered with the cap metallic film CM. It is therefore possible to: prevent moisture and the like from intruding into the redistribution line RM from the exterior or a copper film configuring the redistribution line RM from ionizing and migrating (diffusing) to the exterior; and improve the reliability of the semiconductor device having the redistribution line.

Since the redistribution line RM and the wire 27 adhere to each other with an adhesive film to improve the adhesiveness between them interposed and the cap barrier film CM2 that is to be the adhesive film is comprised of a thin film, it is possible to prevent the deterioration of the productivity of the semiconductor device caused by the warping of a wafer. The present inventors recognize the problem in that, when an adhesive film comprising a nickel (Ni) film formed by a plating method is interposed between the redistribution line RM and the wire 27 for example, the nickel film formed by a plating method having a poor film thickness controllability comes to be a heavy film and hence the warping of a wafer is caused. According to the present embodiment, it is possible to: reduce the warping of the wafer by forming the cap barrier film CM2 that is to be the adhesive film so as to be a thin film by a sputtering method having a high film thickness controllability; and improve the productivity of the semiconductor device.

<Manufacturing Method of Semiconductor Device>

A manufacturing method of a semiconductor device according to Embodiment 1 is explained hereunder and is explained by focusing attention on a method for manufacturing a redistribution line that is a feature of Embodiment 1. The method for manufacturing a redistribution line corresponds to the section shown in FIG. 4.

Figure 5:
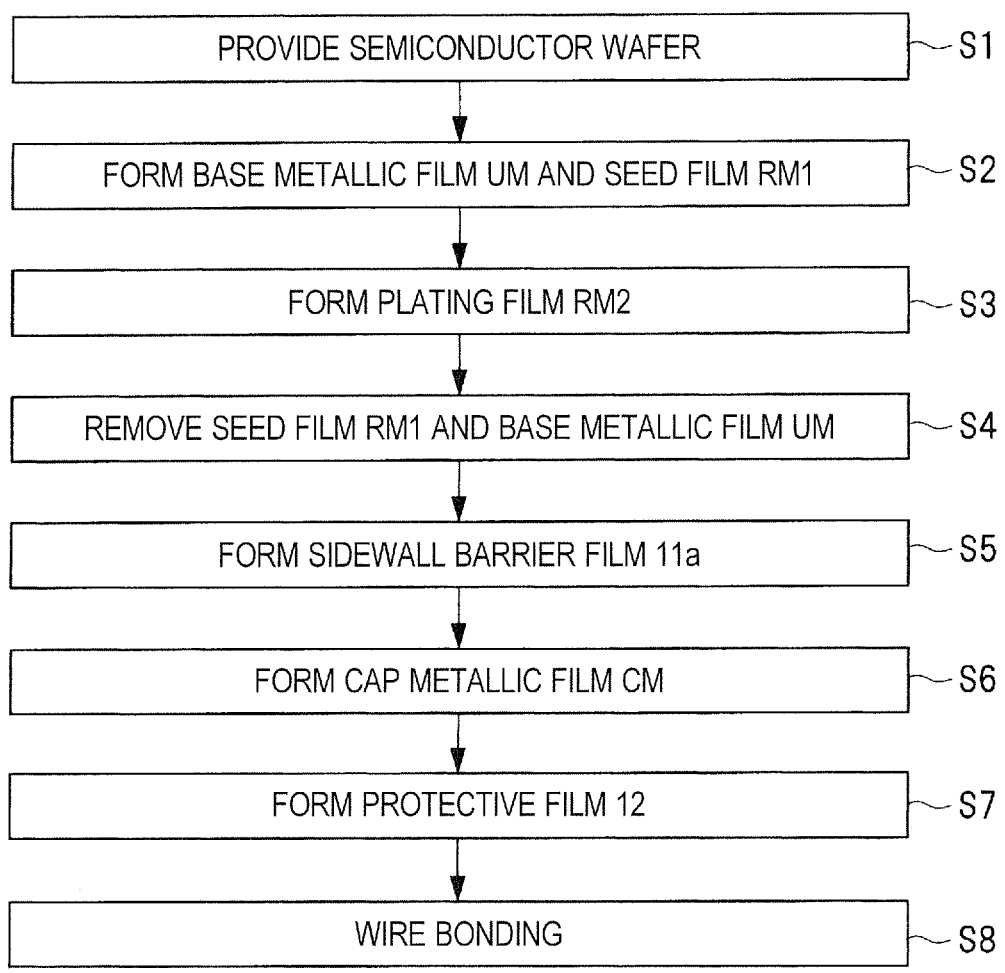
FIG. 5 is a process flow diagram showing a part of the manufacturing process of a semiconductor device according to Embodiment 1.

FIG. 5 is a process flow diagram showing a part of the manufacturing process of a semiconductor device according to Embodiment 1. FIGS. 6 to 12 are sectional views of the semiconductor device according to Embodiment 1 during the manufacturing processes.

Figure 6:
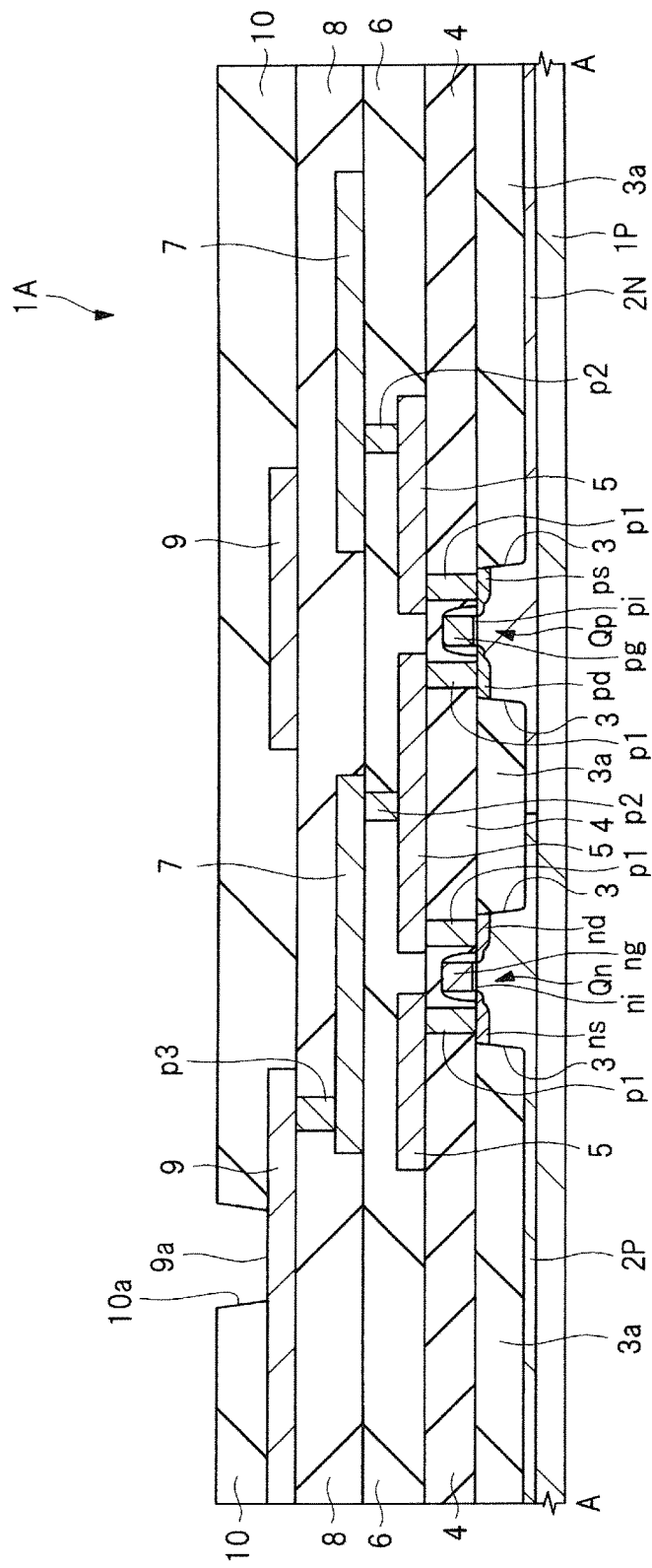
FIG. 6 is a sectional view of a semiconductor device according to Embodiment 1 during a manufacturing process.

FIG. 6 corresponds to the "semiconductor wafer providing" process (S1) in the process flow diagram shown in FIG. 5 and shows the process of providing a semiconductor wafer in which a plurality of wiring layers and pad electrodes are formed. Over a semiconductor substrate 1P, a p-channel type MIS transistor (Qp) and an n-channel type MIS transistor (Qn) are formed and then a wire comprising a plurality of wiring layers is formed. Concretely, as shown in FIG. 4, a three-layered wiring layer (a first layered Al wire 5, a second layered Al wire 7, and a third layered Al wire 9) is formed. Then a surface protective film 10 is formed above the third layered Al wire 9, the surface protective film 10 has a pad opening 10a, and the part, exposed through the pad opening 10a, of the third layered Al wire 9 that is the uppermost layer comes to be a pad electrode 9a. The sectional structure shown in FIG. 6 is the same as that explained in FIG. 4.

Figure 7:
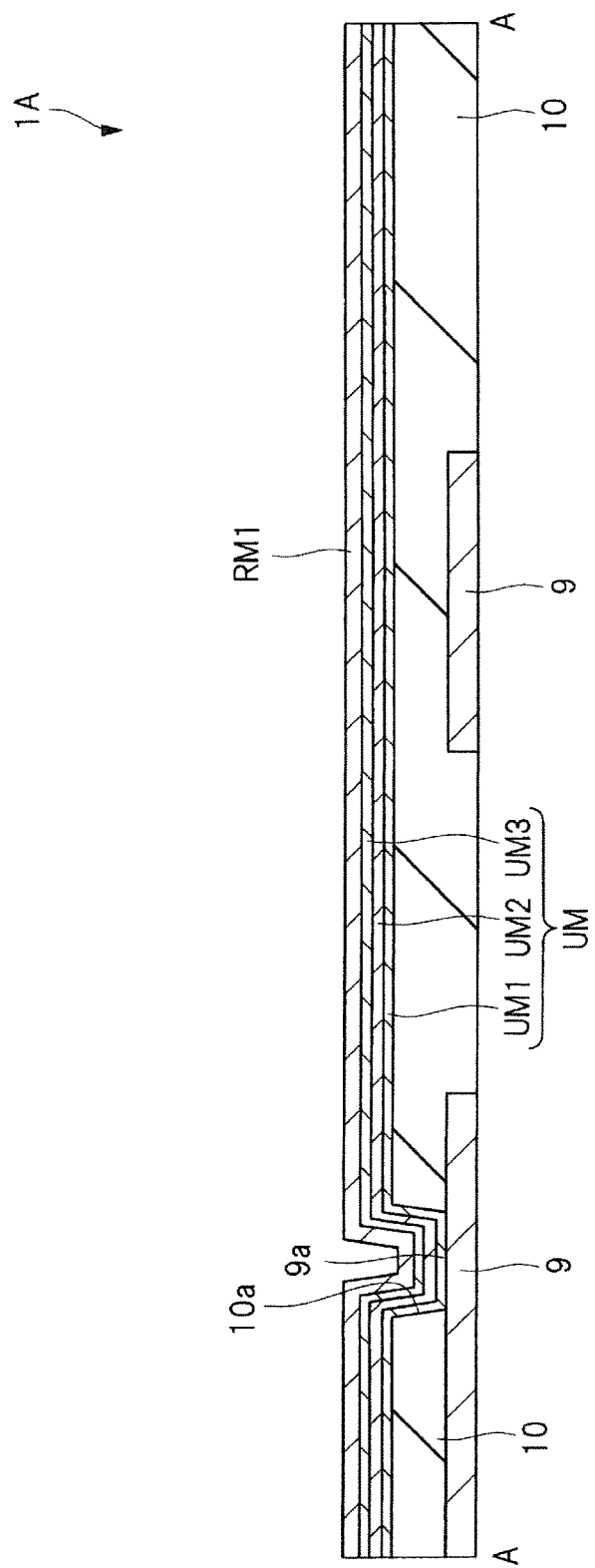
FIG. 7 is a sectional view of the semiconductor device during a manufacturing process subsequent to FIG. 6.

FIG. 7 shows the "base metallic film UM and seed film RM1 forming" process (S2) in the process flow diagram shown in FIG. 5. Firstly, a base metallic film UM and a seed film RM1, those being electrically coupled to the pad electrode 9a trough the pad opening 10a, are formed (deposited) over the surface protective film 10. A first base barrier film UM1, a second base barrier film UM2, and a third base barrier film UM3 configuring the base metallic film UM comprise a titanium (Ti) film of 10 nm, a titanium nitride (TiN) film of 50 nm, and a titanium (Ti) film of 10 nm respectively in sequence. The first base barrier film UM1, the second base barrier film UM2, and the third base barrier film UM3 are formed by a sputtering method or a CVD method for example. Successively, the seed film RM1 comprising a copper (Cu) film is formed over the third base barrier film UM3 by a sputtering method. The film thickness of the seed film RM1 is set at about 250 nm. Here, the seed film RM1 may contain an additive such as aluminum (Al).

Figure 8:
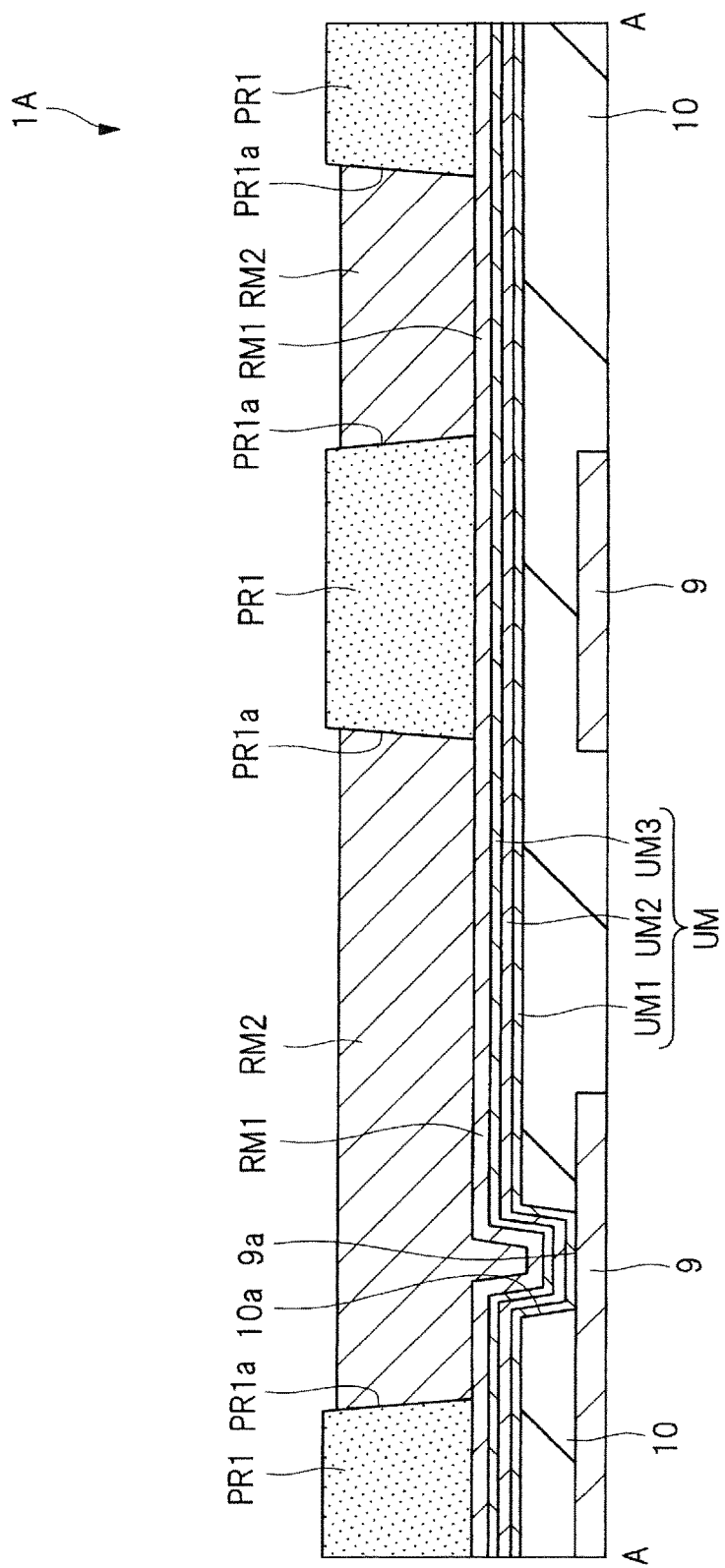
FIG. 8 is a sectional view of the semiconductor device during a manufacturing process subsequent to FIG. 7.

FIG. 8 corresponds to the "plating film RM2 forming" process (S3) in the process flow diagram shown in FIG. 5. A resist mask (resist pattern) PR1 that exposes the region where a redistribution line RM is formed and covers the region where the redistribution line RM is not formed is formed over the seed film RM1. That is, the resist mask PR1 is a reverse pattern of the first plane pattern P1 and has an opening corresponding to the first plane pattern P1. On this occasion, the side surface PR1a of the resist mask PR1 is forwardly tapered and the width of the lower surface of the resist mask PR1 is larger than the width of the upper surface. Successively, a plating film RM2 comprising a copper (Cu) film is formed selectively over the seed film RM1 in the region exposed through the resist mask PR1 with the base metallic film UM and the seed film RM1 used as the seed layers by an electrolytic (electric) plating method. The film thickness of the plating film RM2 is set at about 6 μm for example. The plating film RM2 having the first plane pattern P1 is formed through the process.

Figure 9:
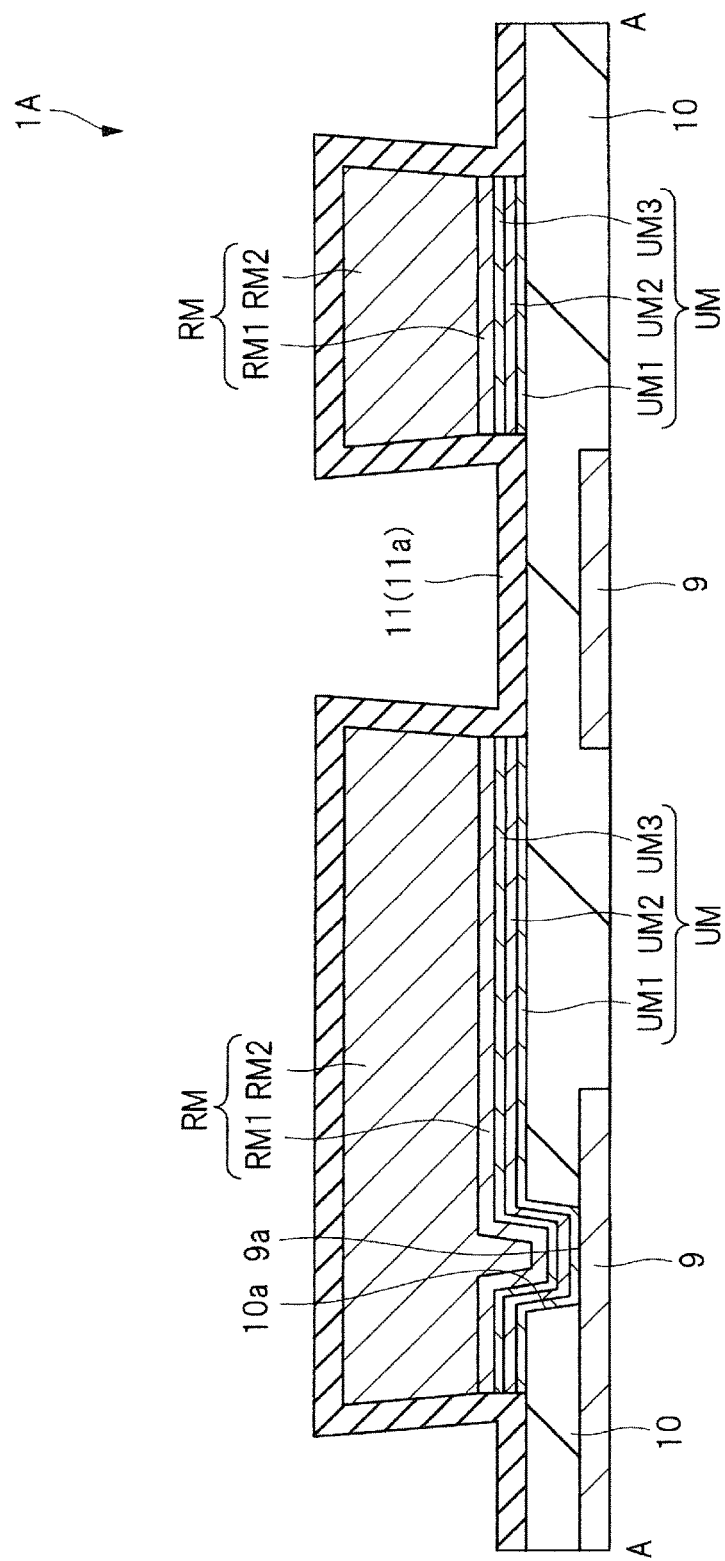
FIG. 9 is a sectional view of the semiconductor device during a manufacturing process subsequent to FIG. 8.

FIG. 9 corresponds to the "seed film RM1 and base metallic film UM removing" process (S4) and the "sidewall barrier film 11a forming" process (S5) in the process flow diagram shown in FIG. 5. After the plating film RM2 is formed, the resist mask PR1 is removed. Successively, the seed film RM1 and the base metallic film UM (the third base barrier film UM3, the second base barrier film UM2, and the first base barrier film UM1) in the region exposed through the plating film RM2 are etched and removed. As a result, the seed film RM1 and the base metallic film UM (the third base barrier film UM3, the second base barrier film UM2, and the first base barrier film UM1), those being patterned and having the plane pattern identical to the plating film RM2, remain under the plating film RM2. Through the process, a redistribution line RM having the first plane pattern P1 and comprising the laminated structure of the seed film RM1 and the plating film RM2 is formed. A mixed liquid of sulfuric acid, a hydrogen peroxide solution, and water is used for the etching of the seed film RM1 for example and a mixed liquid of ammonia, a hydrogen peroxide solution, and water is used for the etching of the base metallic film UM.

According to the studies by the present inventors, it has been obvious that the side surface of the redistribution line RM is inversely tapered and unevenness is caused at the side surface of the redistribution line RM at the stage of finishing the etching of the seed film RM1 and the base metallic film UM.

Successively, in order to form a sidewall barrier film 11a, an inorganic insulating film 11 is formed so as to cover the upper surface and side surface of the redistribution line RM and the side surface of the base metallic film UM by a CVD method (a plasma CVD method for example). As the inorganic insulating film 11, a silicon oxide film or a silicon nitride film can be used and here a silicon nitride film having a film thickness of 0.1 to 3 μm is used. Since a film formed by a CVD method is excellent in coverability in comparison with a film formed by a sputtering method, it is possible to fill the unevenness of the side surface of the redistribution line RM with the inorganic insulating film 11 formed over the side surface of the redistribution line RM and the surface of the inorganic insulating film 11 formed over the side surface of the redistribution line RM is smoothened.

Figure 10:
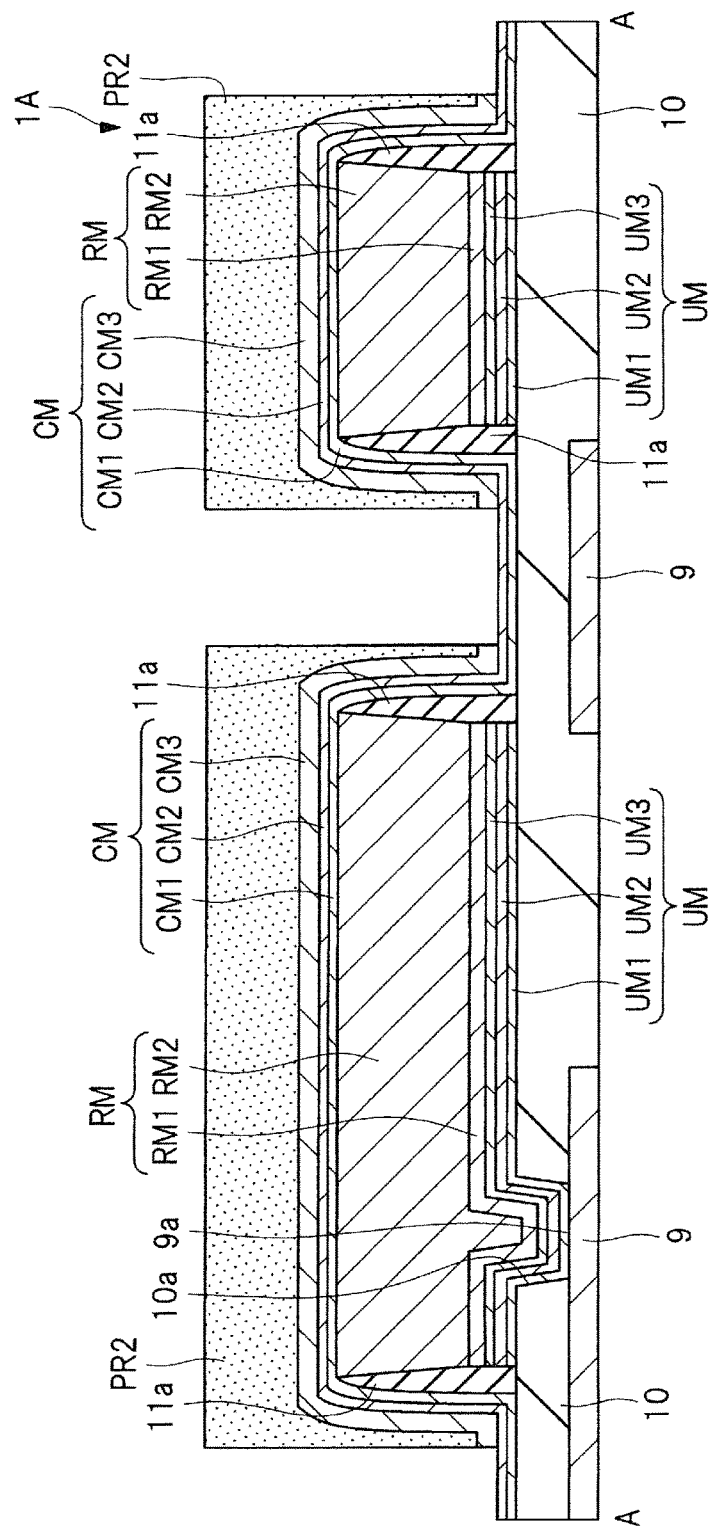
FIG. 10 is a sectional view of the semiconductor device during a manufacturing process subsequent to FIG. 9.

FIG. 10 corresponds to the "sidewall barrier film forming" process (S5) and the "cap metallic film CM forming" process (S6) in the process flow diagram shown in FIG. 5.

Anisotropic dry etching is applied to the inorganic insulating film 11 formed so as to cover the upper surface and side surface of the redistribution line RM and a sidewall barrier film 11a is formed selectively over the side surface of the redistribution line RM. That is, the inorganic insulating film 11 over the upper surface of the redistribution line RM is removed completely and the inorganic insulating film 11 formed over the surface protective film 10 is removed except the inorganic insulating film 11 formed over the side surface of the redistribution line RM.

Successively, a cap metallic film CM is formed (deposited) so as to completely cover the upper surface of the redistribution line RM and the sidewall barrier film 11a. The cap metallic film CM comprises a multi-layered cap barrier film. In order to form the cap metallic film CM, a first cap barrier film CM1, a second cap barrier film CM2, and a third cap barrier film CM3 are formed (deposited) in sequence by a sputtering method. Here, in Embodiment 1, the third cap barrier film CM3 is regarded as a part of the cap metallic film CM but the third cap barrier film CM3 is a mask film for processing the second cap barrier film CM2 and does not exist in the state of finishing the processing of the cap metallic film CM. Appropriately, the first cap barrier film CM1, the second cap barrier film CM2, and the third cap barrier film CM3 comprise a titanium (Ti) film 10 to 200 nm, a palladium (Pd) film 10 to 200 nm, and a titanium (Ti) film 10 to 200 nm in film thickness, respectively. Here, as an example, the titanium (Ti) film of the lower layer is set at 50 nm, the palladium (Pd) film is set at 50 nm, and the titanium (Ti) film of the upper layer is set at 175 nm. Since the sidewall barrier film 11a is formed over the side surface of the redistribution line RM, it is possible to form the first cap barrier film CM1, the second cap barrier film CM2, and the third cap barrier film CM3 continuously without a break from the upper surface of the redistribution line RM to the upper surface of the surface protective film 10.

Successively, as shown in FIG. 10, a resist mask PR2 is formed over the third cap barrier film CM3. The resist mask PR2 corresponds to the second plane pattern P2 and, in a plan view, is patterned so as to cover the redistribution line RM and a flared section PP around the redistribution line RM and expose the other parts.

Successively, the third cap barrier film CM3 in the region exposed through the resist mask PR2 is removed by dry etching or wet etching and the third cap barrier film CM3 having the second plane pattern P2 is formed. As the wet etching liquid, a mixed liquid of ammonia, a hydrogen peroxide solution, and water can be used. That is, the third cap barrier film CM3 is patterned by using the resist mask PR2.

Figure 11:
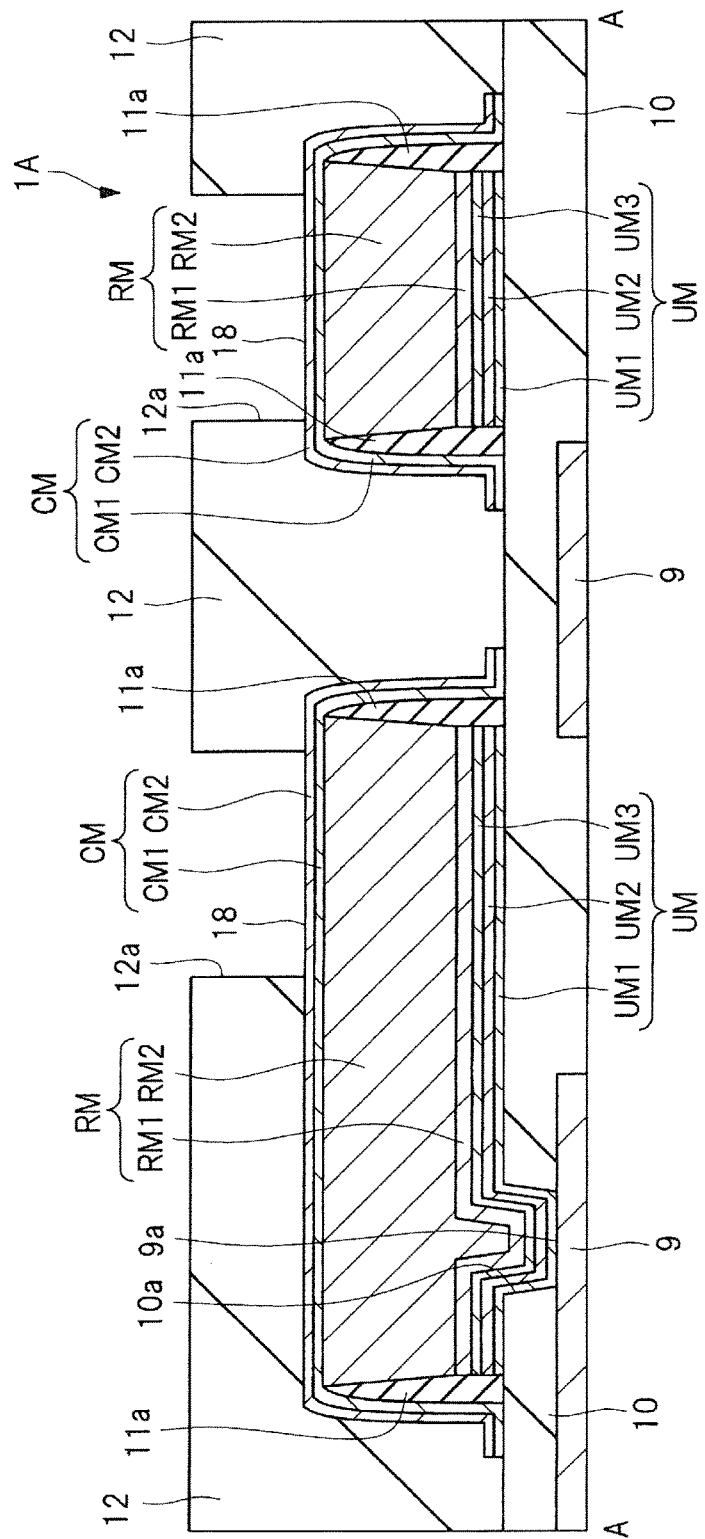
FIG. 11 is a sectional view of the semiconductor device during a manufacturing process subsequent to FIG. 10.

FIG. 11 corresponds to the "cap metallic film CM forming" process (S6) and the "protective film 12 forming" process (S7) in the process flow diagram shown in FIG. 5.

After the third cap barrier film CM3 is patterned, the resist mask PR2 is removed. Then the second cap barrier film CM2 is etched with the third cap barrier film CM3 comprising a patterned titanium (Ti) film used as a hard mask and the second cap barrier film CM2 having the second plane pattern P2 is formed. The second cap barrier film CM2 comprising a palladium (Pd) film is wet-etched with a potassium iodide solution. That is, the second cap barrier film CM2 is patterned (etched) with the third cap barrier film CM3 used as a mask. The present inventors have recognized the harmful effect that, if the sidewall barrier film 11a does not exist and a break exists in the first cap barrier film CM1 and the second cap barrier film CM2 in the process of etching the second cap barrier film CM2, the copper film configuring the redistribution line RM corrodes and comes to be a foreign matter by the intrusion of the etching liquid and the manufacturing yield lowers. According to Embodiment 1, since no break exists in the first cap barrier film CM1 and the second cap barrier film CM2, it is possible to prevent the copper film configuring the redistribution line RM from corroding. Further, when a silicon nitride film is used as the sidewall barrier film 11a, it is possible to prevent the copper film configuring the redistribution line RM from corroding even if a break exists in the first cap barrier film CM1 and the second cap barrier film CM2. Here, the second cap barrier film CM2 may also be etched by a dry etching method.

Successively, the first cap barrier film CM1 in the region exposed through the third cap barrier film CM3 and the second cap barrier film CM2 is etched and removed and the upper surface of the surface protective film 10 is exposed. Since the first cap barrier film CM1 and the third cap barrier film CM3 comprise titanium (Ti) films, it is possible to remove also the third cap barrier film CM3 remaining over the upper surface of the redistribution line RM and over the sidewall barrier film 11a and expose the upper surface of the second cap barrier film CM2 at the process of etching the first cap barrier film CM1. For the etching of the first cap barrier film CM1, a mixed liquid of ammonia, a hydrogen peroxide solution, and water can be used. That is, by forming the third cap barrier film CM3 with the same film (the same kind of film) as the first cap barrier film CM1, it is possible to shorten (reduce) the manufacturing process.

Successively, a protective film 12 that covers the upper surface and side surface of the redistribution line RM and has an opening 12a to expose an external pad electrode 18 formed at the upper surface of the redistribution line RM is formed. The protective film 12 is thicker than the redistribution line RM and is in contact with the upper surface of the surface protective film 10 in the region between adjacent redistribution lines RM. The cap metallic film CM covering the adjacent redistribution lines RM is insulated by the protective film 12. As the protective film 12, a photosensitive polyimide resin is used for example. After a photosensitive polyimide is applied and exposed over the redistribution line RM and the opening 12a to expose the external pad electrode 18 is formed, the photosensitive polyimide is cured and hardened.

Figure 12:
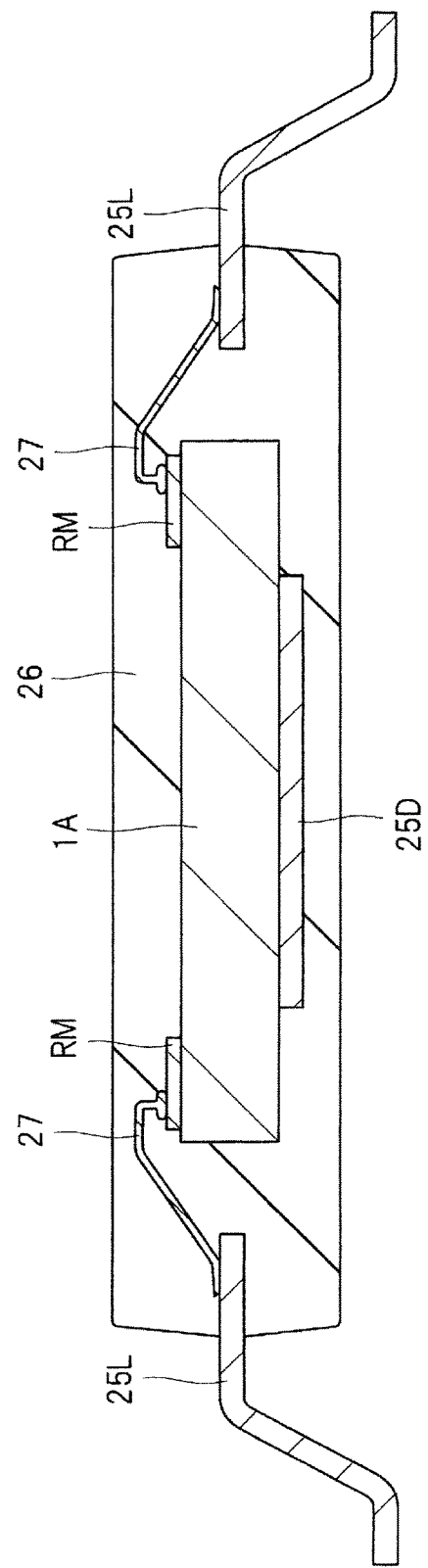
FIG. 12 is a sectional view of the semiconductor device during a manufacturing process subsequent to FIG. 11.

FIG. 12 shows the process of mounting a semiconductor chip 1A including the "wire bonding" process (S8) in the process flow diagram shown in FIG. 5. After the above processes, the semiconductor chip 1A is mounted over a die pad section 25D, redistribution lines RM and leads 25L are coupled through wires 27, successively parts of the leads 25L (inner lead sections), the die pad section 25D, the semiconductor chip 1A, and the wires 27 are sealed by a sealing body (sealing resin) 26, and thus a semiconductor device (semiconductor integrated circuit device) according to Embodiment 1 is completed.

As shown in FIG. 12, the semiconductor chip 1A having a plurality of redistribution lines RM is mounted over the die pad section 25D and coupled electrically to a plurality of leads 25L through the wires 27. Parts of the leads 25L (inner lead sections), the die pad section 25D, the semiconductor chip 1A, and the wires 27 are sealed by a sealing body (sealing resin) 26 including a thermosetting epoxy resin for example. Further, besides an epoxy resin, a filler such as silica ($SiO_2$) is contained in the sealing body 26. Each of the leads 25L has an outer lead section extending from the inner lead section covered with the sealing body 26 to the exterior of the sealing body 26.

An end of each of the wires 27 is coupled to the external pad electrode 18 formed over the upper surface of each of the redistribution lines RM in the semiconductor chip 1A shown in FIG. 4 or 12 and the other end is coupled to the inner lead section of each of the leads 25L. The die pad section 25D and the leads 25L are comprised of copper (Cu) or 42 alloy (iron nickel alloy) and the wires 27 are comprised of copper (Cu) for example.

Since the second cap barrier film CM2 comprised of a palladium (Pd) film is exposed at the surface of the external pad electrode 18 and the wire 27 comprised of copper is coupled by bonding to the second cap barrier film CM2 comprising a palladium (Pd) film, bonding having a stable and sufficient bonding strength can be obtained and highly-reliable bonding having a high shear strength can be obtained.

Here, as the wire 27, a copper wire the surface of which is coated with palladium (Pd) (Pd-coated Cu wire) or a gold wire (Au wire) may also be used.

<Features in Manufacturing Method of Semiconductor Device>

Major features in the manufacturing method of a semiconductor device according to Embodiment 1 are explained hereunder.

since, after the sidewall barrier film 11a is formed over the side surface of the redistribution line RM, the cap metallic film CM is formed so as to cover the upper surface and side surface of the redistribution line RM by a sputtering method, it is possible to form the cap metallic film CM without a break. Since the upper surface and side surface of the redistribution line RM can be covered with the cap metallic film CM having the diffusion barrier function and the moisture absorption barrier function without a break, it is possible to: prevent withstand voltage deterioration or short circuit between adjacent redistribution lines RM; and improve the reliability of the semiconductor device having the redistribution line RM.

Since the side surface of the redistribution line RM is covered with the sidewall barrier film 11a prior to the wet etching process of the second cap barrier film CM2 configuring the cap metallic film CM, it is possible to prevent an etching liquid from intruding into the redistribution line RM and corroding the copper film configuring the redistribution line RM.

Since the cap metallic film CM is formed after the unevenness of the side surface of the redistribution line RM is filled with the inorganic insulating film 11 formed by a CVD method, it is possible to form the cap metallic film without a break even when the cap metallic film CM is formed by a sputtering method.

Since the sidewall barrier film 11a can be formed by depositing the inorganic insulating film 11 and applying anisotropic dry etching and a mask is not used, it is possible to reduce the number of the manufacturing processes and the manufacturing cost.

Since the sidewall barrier film 11a comprised of the inorganic insulating film is formed over the side surface of the redistribution line RM and thus the redistribution line RM comprised of a copper film is covered with the sidewall barrier film 11a that is harder than the redistribution line RM, it is possible to obtain a stable bonding when the wire 27 is coupled by bonding to the cap metallic film CM (second cap barrier film CM2). If the sidewall barrier film 11a is not formed over the side surface of the redistribution line RM, there is the possibility that the redistribution line RM deforms in the lateral direction (direction perpendicular to the thickness direction) during bonding coupling, the pressure applied to the redistribution line RM during the bonding coupling lowers undesirably, and bonding failure is caused. According to Embodiment 1, since the deformation of the redistribution line RM can be inhibited by the hard sidewall barrier film 11a and the pressure can be applied sufficiently to the cap metallic film CM (second cap barrier film CM2) during the bonding coupling, a stable bonding can be obtained. Further, over the side surface of the redistribution line RM too, since the cap metallic film CM having a viscosity higher than the inorganic insulating film is formed further over the sidewall barrier film 11a comprised of the inorganic insulating film, it is possible to further inhibit the redistribution line RM from deteriorating in the lateral direction during the bonding coupling.

(Embodiment 2)

Embodiment 2 is a modified example on the structure and manufacturing method of the sidewall barrier film 11a according to Embodiment 1. The explanations are made by using a different code to a part different from Embodiment 1. A part identical to Embodiment 1 is represented by an identical code. A semiconductor chip 1B is used in Embodiment 2 in order to be distinguished from Embodiment 1.

Figure 13:
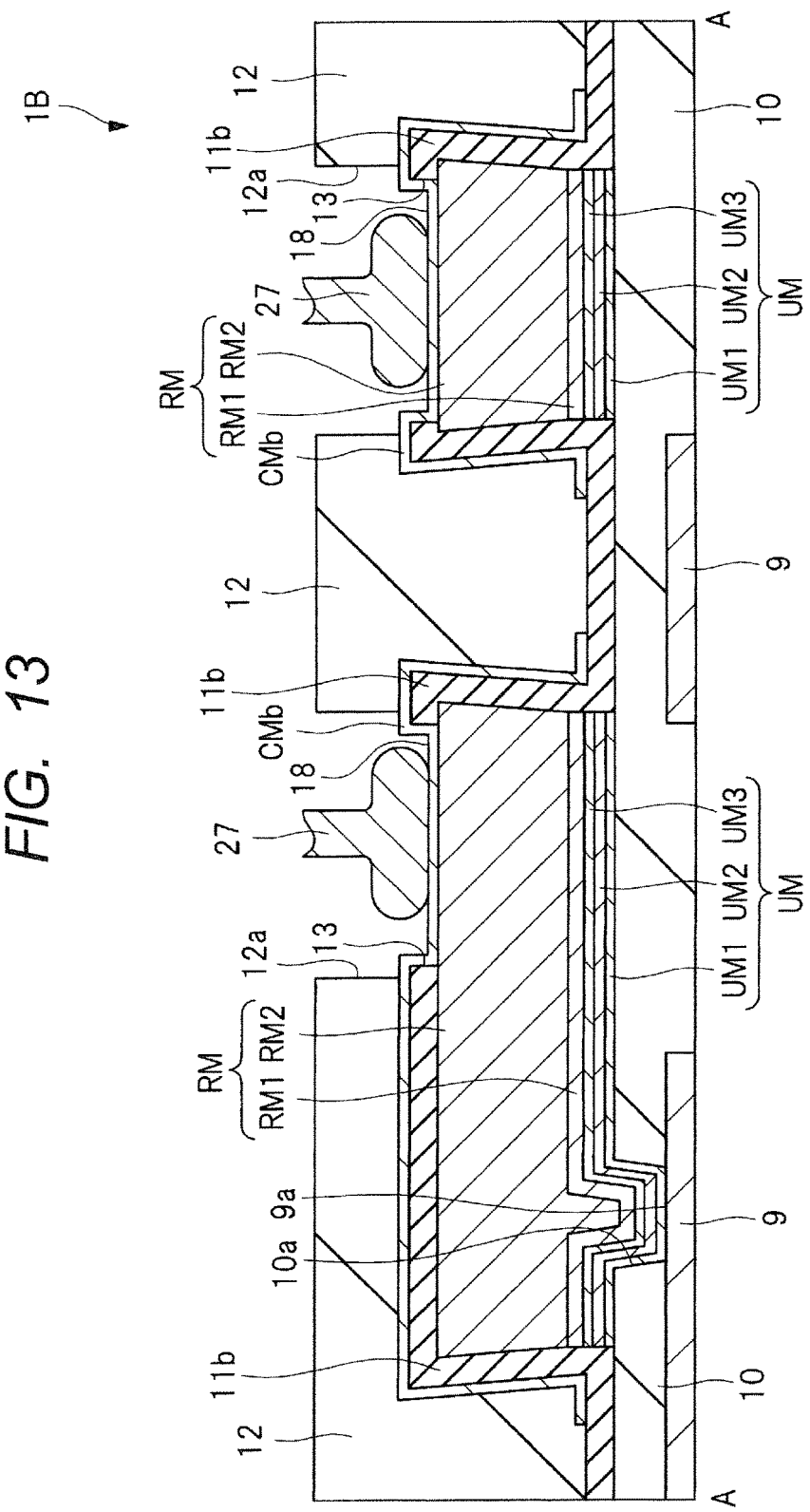
FIG. 13 is a sectional view of a semiconductor device according to Embodiment 2.

FIG. 13 is a sectional view of a semiconductor device according to Embodiment 2. FIG. 13 corresponds to a section taken on line A-A of FIG. 3. In the semiconductor device according to Embodiment 2, the upper surface and side surface of a redistribution line RM are covered with a sidewall barrier film 11b. The sidewall barrier film 11b is in contact with and covers the upper surface and side surface of the redistribution line RM and is also formed continuously over the upper surface of a surface protective film 10. The sidewall barrier film 11b is in contact with and covers the side surface of a base metallic film UM. Here, the sidewall barrier film 11b has an opening 13 at a position corresponding to an external pad electrode 18 at the upper surface of the redistribution line RM, a cap metallic film CMb formed over the sidewall barrier film 11b is in contact with the upper surface of the redistribution line RM at the opening 13, and a wire 27 is coupled to the cap metallic film CMb.

In Embodiment 2, it is vital to form the sidewall barrier film 11b by a silicon nitride film having the diffusion barrier function and the moisture absorption barrier function. Further, the silicon nitride film configuring the sidewall barrier film 11b is formed by a CVD method.

Figure 14:
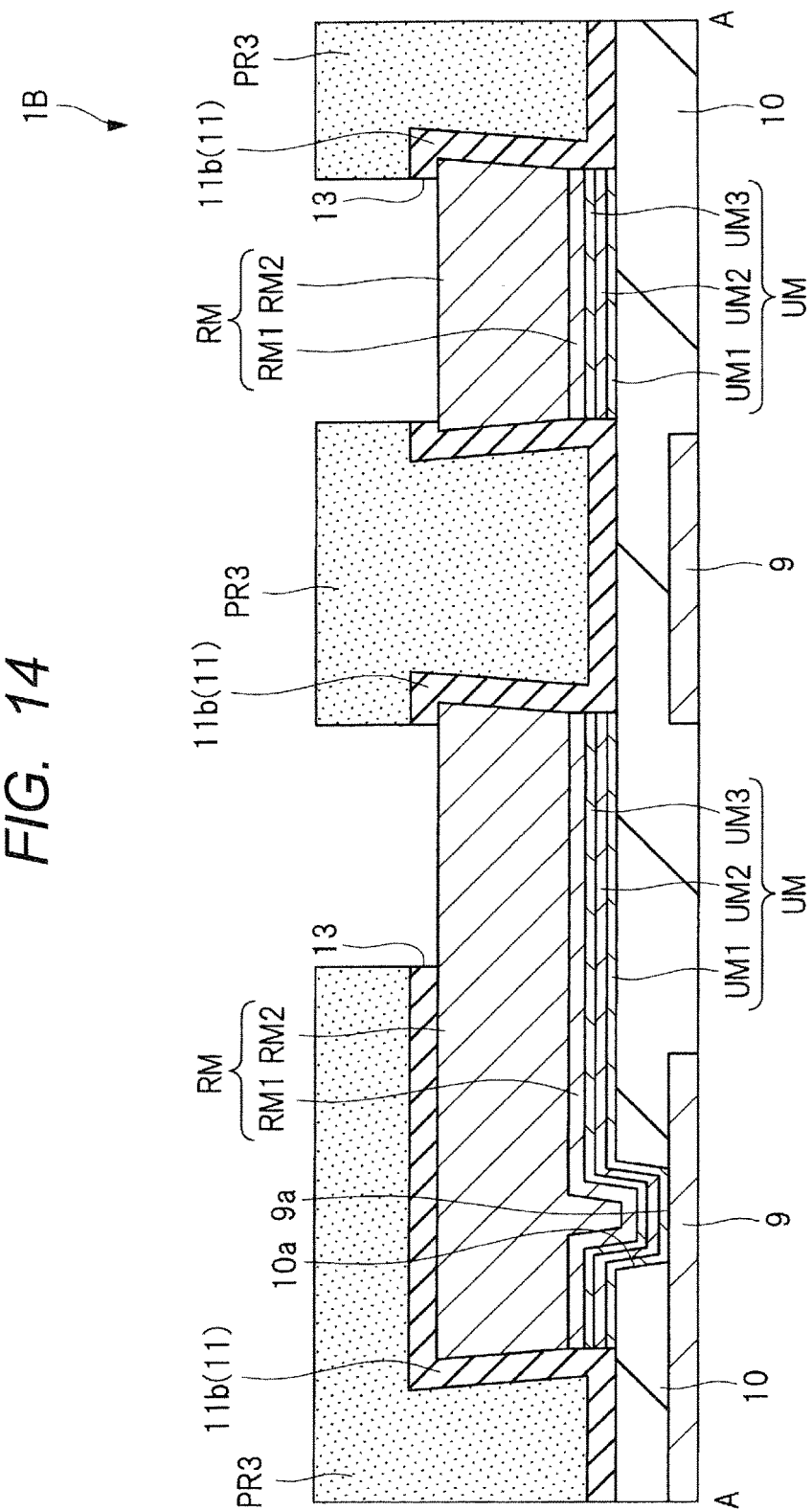
FIG. 14 is a sectional view of a semiconductor device according to Embodiment 2 during a manufacturing process.

FIG. 14 is a sectional view of a semiconductor device according to Embodiment 2 during a manufacturing process. After the processes (S1 to S4) shown in FIG. 5 of Embodiment 1 are applied, in the same manner as Embodiment 1, an inorganic insulating film 11 is formed so as to cover the upper surface and side surface of a redistribution line RM by a CVD method. Successively, a sidewall barrier film 11b having an opening 13 is formed by using a resist mask PR3 and applying etching to the inorganic insulating film 11. After the resist mask PR3 is removed, by applying the processes (S6 to S8) shown in FIG. 5, the semiconductor device according to Embodiment 2 is completed.

Embodiment 2, unlike Embodiment 1, has the feature of not using anisotropic dry etching when the sidewall barrier film 11b is formed.

Further, it is vital that the cap metallic film CMb covers the whole opening 13 formed in the sidewall barrier film 11b, extends over the sidewall barrier film 11b, and overlaps with the sidewall barrier film 11b. The cap metallic film CMb is only required to cover the end part of the sidewall barrier film 11b located over the upper surface of the redistribution line RM and is not required to extend up to the side surface of the redistribution line RM.

The upper surface and side surface of the redistribution line RM formed over a base metallic film UM are covered with the sidewall barrier film 11b or the cap metallic film CMb, those having the diffusion barrier function or the moisture absorption barrier function. Then the opening 13 in the sidewall barrier film 11b is covered with the cap metallic film CMb and the cap metallic film CMb extends over the sidewall barrier film 11b and overlaps with the sidewall barrier film 11b. By the configuration, it is possible to: prevent moisture and the like from intruding into the redistribution line RM from the exterior or prevent a copper film configuring the redistribution line RM from ionizing and migrating (diffusing) to the exterior; and improve the reliability of the semiconductor device having the redistribution line.

(Embodiment 3)

Embodiment 3 is a modified example on the structure and manufacturing method of the base metallic film UM, the sidewall barrier film 11a, and the cap metallic film CM according to Embodiment 1. The explanations are made by using a different code to a part different from Embodiment 1. A part identical to Embodiment 1 is represented by an identical code. A semiconductor chip 1C is used in Embodiment 3 in order to be distinguished from Embodiment 1.

Figure 15:
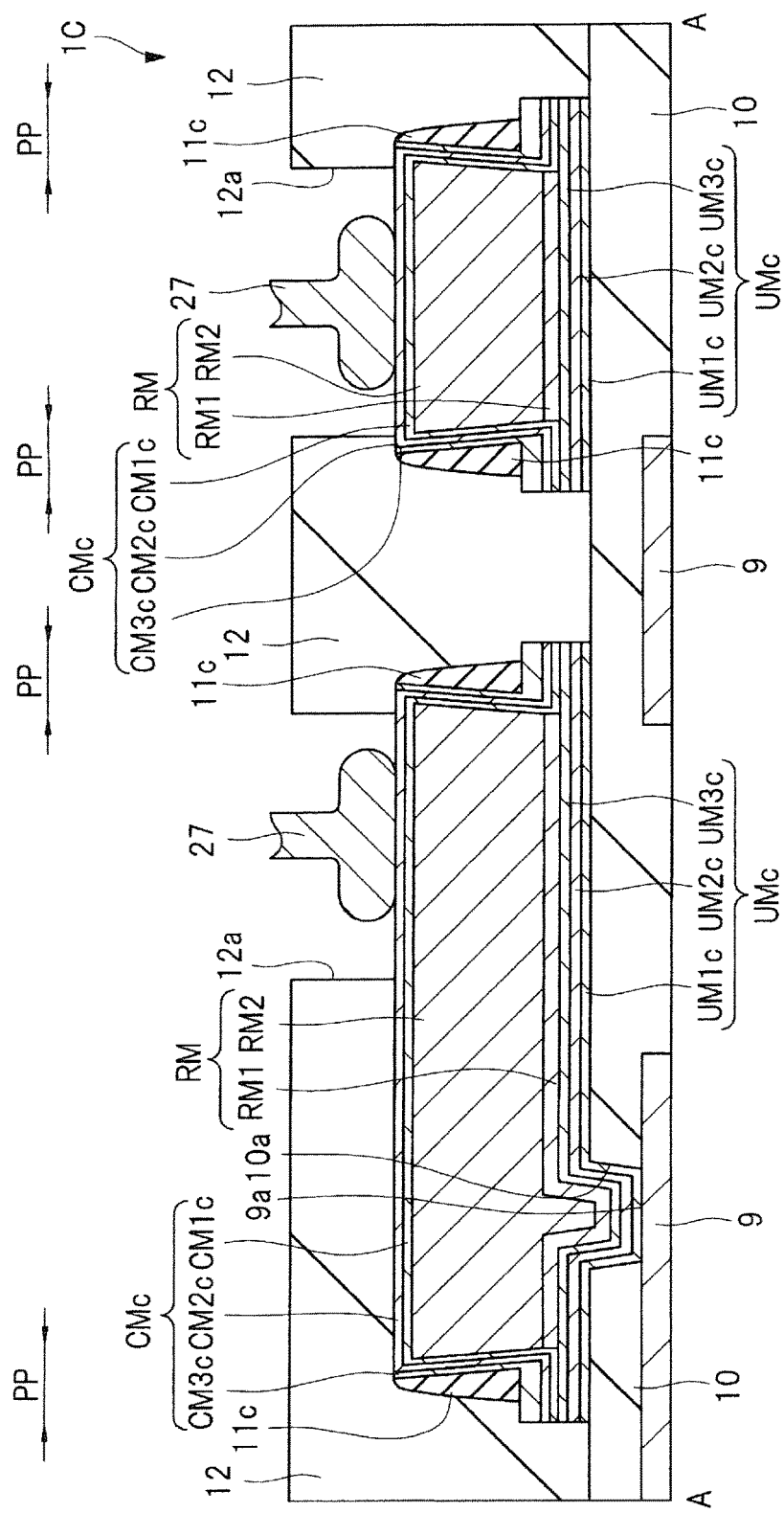
FIG. 15 is a sectional view of a semiconductor device according to Embodiment 3.

FIG. 15 is a sectional view of a semiconductor device according to Embodiment 3. FIG. 15 corresponds to the section taken on line A-A of FIG. 3. In the semiconductor device according to Embodiment 3, the upper surface and side surface of a redistribution line RM are covered with a cap metallic film CMc and a sidewall barrier film 11c is formed over the side surface of the redistribution line RM so as to cover the cap metallic film CMc. Further, a base metallic film UMc is in contact with the cap metallic film CMc at a flared section PP.

The base metallic film UMc comprises a base barrier film of a three-layered structure and comprises a first base barrier film UM1c, a second base barrier film UM2c, and a third base barrier film UM3c in sequence from the side of a pad electrode 9a and the respective base barrier films are the same as the first base barrier film UM1, the second base barrier film UM2, and the third base barrier film UM3 in Embodiment 1. Here, the base metallic film UMc extends from the lower surface of the redistribution line RM up to the flared section PP that is the outside of the redistribution line RM.

The cap metallic film CMc has a three-layered structure of a first cap barrier film CM1c, a second cap barrier film CM2c, and a third cap barrier film CM3c and the respective cap barrier films are the same as the first cap barrier film CM1, the second cap barrier film CM2, and the third cap barrier film CM3 in Embodiment 1. Here, the cap metallic film CMc directly covers the upper surface and side surface of the redistribution line RM, the upper surface of the redistribution line RM is covered with the double-layered structure of the first cap barrier film CM1c and the second cap barrier film CM2c and the side surface is covered with the three-layered structure of the first cap barrier film CM1c, the second cap barrier film CM2c, and the third cap barrier film CM3c. Then the base metallic film UMc is in contact with the cap metallic film CMc at the flared section PP. Concretely, the third base barrier film UM3c of the base metallic film UMc is in contact with the first cap barrier film CM1c of the cap metallic film CMc.

A sidewall barrier film 11c is formed so as to cover the side surface of the redistribution line RM with the cap metallic film CMc interposed. The sidewall barrier film 11c is comprised of a silicon nitride film having the diffusion barrier function and the moisture absorption barrier function.

Figure 16:
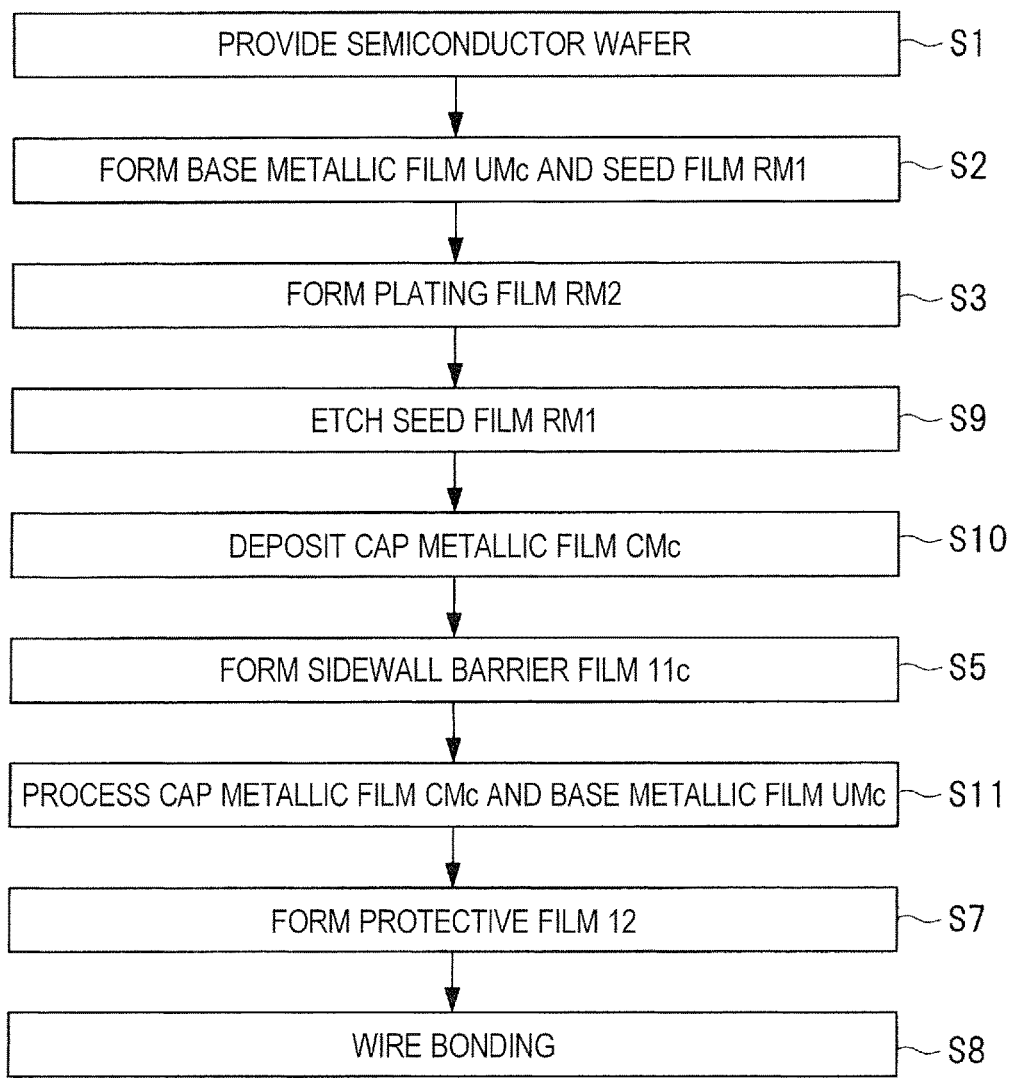
FIG. 16 is a process flow diagram showing a part of the manufacturing process of a semiconductor device according to Embodiment 3.
Figure 17:
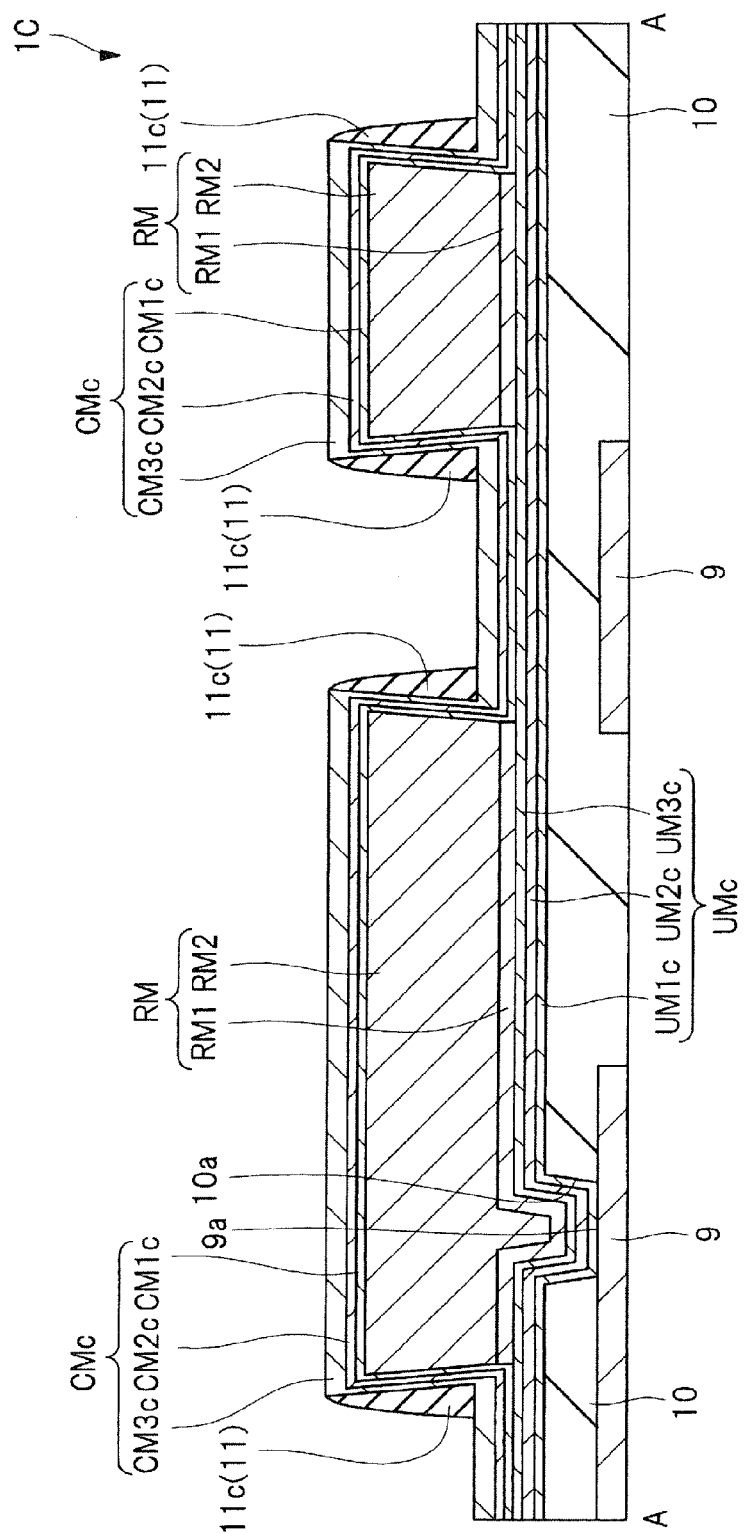
FIG. 17 is a sectional view of a semiconductor device according to Embodiment 3 during a manufacturing process.
Figure 18:
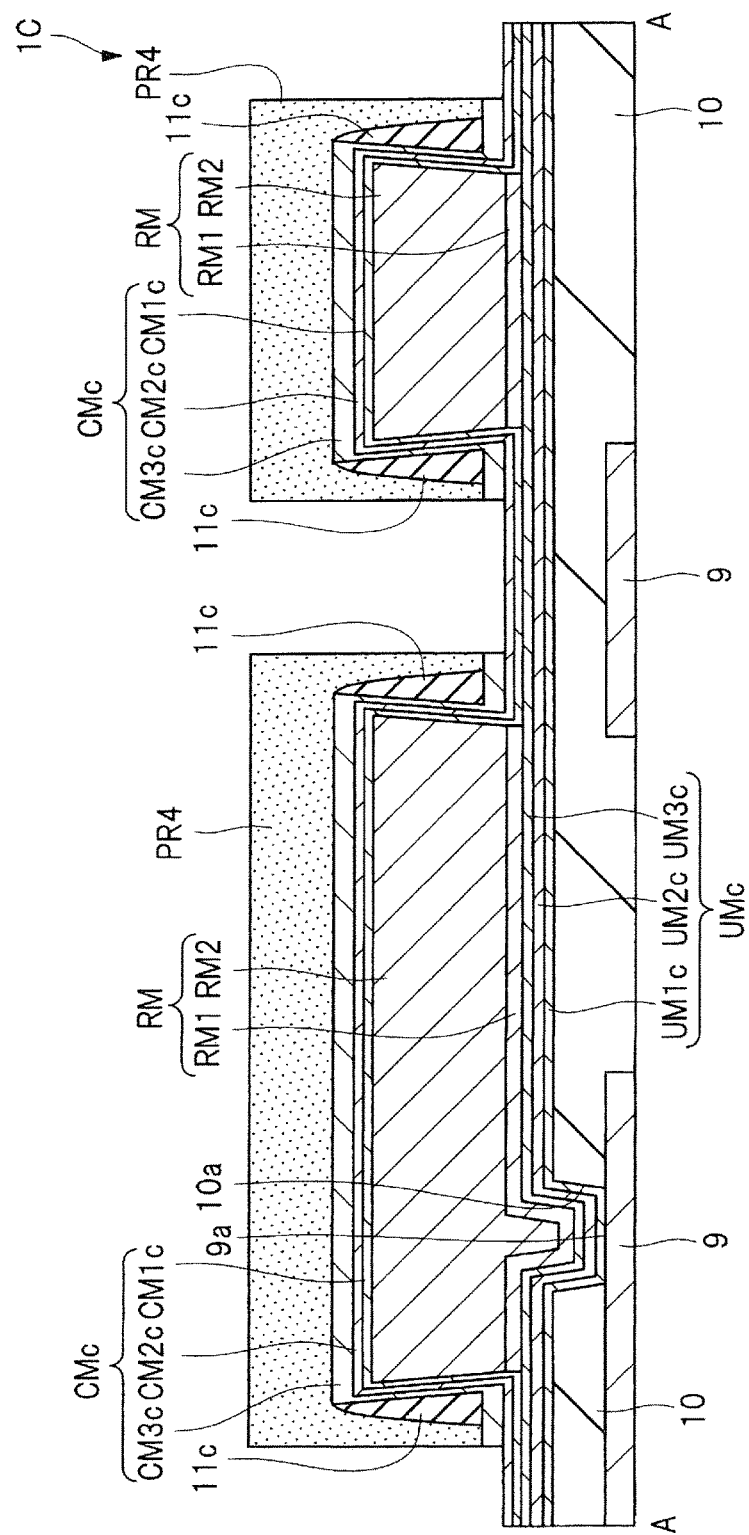
FIG. 18 is a sectional view of the semiconductor device during a manufacturing process subsequent to FIG. 17.
Figure 19:
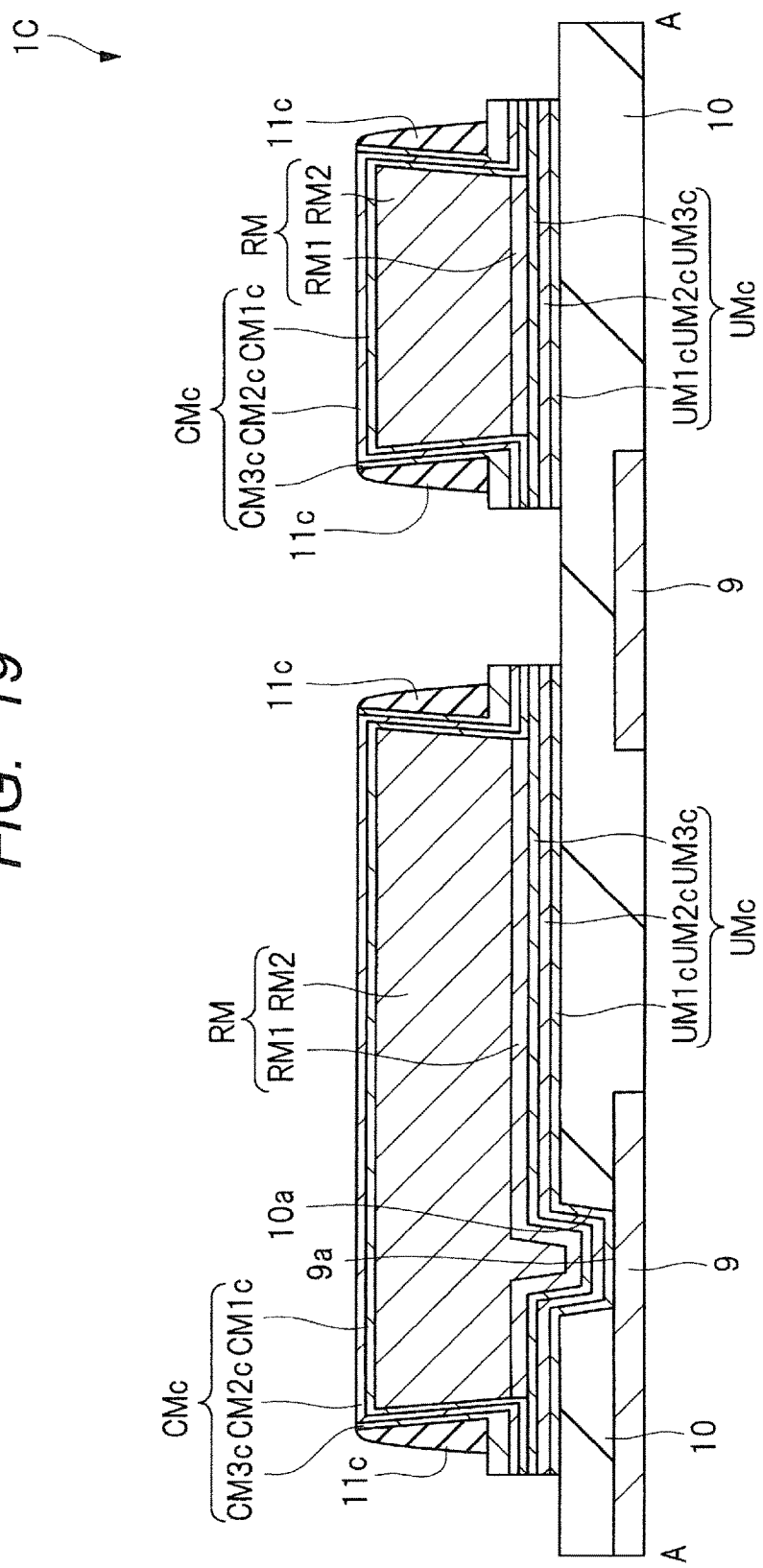
FIG. 19 is a sectional view of the semiconductor device during a manufacturing process subsequent to FIG. 18.

FIG. 16 is a process flow diagram showing a part of the manufacturing process of a semiconductor device according to Embodiment 3. FIGS. 17 to 19 are sectional views of the semiconductor device according to Embodiment 3 during the manufacturing process.

After the processes (S1 to S3) in the process flow diagram shown in FIG. 5 of Embodiment 1 are applied, a resist mask PR1 is removed. Successively, a seed film RM1 in the region exposed through a plating film RM2 is etched and removed. Unlike Embodiment 1, a base metallic film UM (a third base barrier film UM3, a second base barrier film UM2, and a first base barrier film UM1) remains without being etched (the "seed film RM1 etching" process (S9) in the process flow diagram shown in FIG. 16).

FIG. 17 corresponds to the "cap metallic film CMc depositing" process (S10) and the "sidewall barrier film 11c forming" process (S5) in the process flow diagram shown in FIG. 16. After the seed film RM1 is etched and removed selectively, a cap metallic film CMc is deposited so as to cover the upper surface and side surface of a redistribution line RM. As stated earlier, the cap metallic film CMc has a three-layered structure of a first cap barrier film CM1c, a second cap barrier film CM2c, and a third cap barrier film CM3c and the respective cap barrier films are formed by a sputtering method. The respective cap barrier films are the same as the first cap barrier film CM1, the second cap barrier film CM2, and the third cap barrier film CM3 in Embodiment 1.

Successively, after an inorganic insulating film 11 is deposited so as to cover the cap metallic film CMc by a CVD method, anisotropic dry etching is applied to the inorganic insulating film 11 and a sidewall barrier film 11c is formed. The sidewall barrier film 11c is formed selectively over the side surface of the redistribution line RM with the cap metallic film CMc interposed.

FIGS. 18 and 19 correspond to the "cap metallic film CMc and base metallic film UMc processing" process (S11) in the process flow diagram shown in FIG. 16. As shown in FIG. 18, a resist mask PR4 is formed so as to cover the redistribution line RM and the sidewall barrier film 11c, and the third cap barrier film CM3c in the region exposed through the resist mask PR4 is etched and removed by the same method as Embodiment 1. The resist mask PR4 has the second plane pattern P2 shown in FIG. 3. That is, the third cap barrier film CM3c having the second plane pattern P2 is formed.

Successively, after the resist mask PR4 is removed, the second cap barrier film CM2c is etched with the patterned third cap barrier film CM3c used as a hard mask and the second cap barrier film CM2c having the second plane pattern P2 is formed. The second cap barrier film CM2c comprised of a palladium (Pd) film is wet-etched by using a potassium iodide solution. Successively, the first cap barrier film CM1c and the base metallic film UMc in the region exposed through the patterned third cap barrier film CM3c and second cap barrier film CM2c are etched and removed and the upper surface of a surface protective film 10 is exposed. On this occasion, the third cap barrier film CM3c over the redistribution line RM is also removed simultaneously and the second cap barrier film CM2c is exposed at the upper surface of the redistribution line RM. That is, by forming the first cap barrier film CM1c, the third cap barrier film CM3c, and the base metallic film UMc by the same film (the same kind of films), it is possible to shorten (reduce) the manufacturing process. In this way, the cap metallic film CMc and the base metallic film UMc, those having the second plane pattern P2, are formed.

Successively, by applying the processes (S7 and S8) shown in the process flow diagram of FIG. 16, the semiconductor device according to Embodiment 3 is completed.

The major features of the semiconductor device according to Embodiment 3 are explained hereunder.

The redistribution line RM comprised of a copper film is formed over the base metallic film UMc and has the upper surface and the side surface. The upper surface of the redistribution line RM is covered with the cap metallic film CMc having the diffusion barrier function or the moisture absorption barrier function and the side surface of the redistribution line RM is covered with the sidewall barrier film 11c with the cap metallic film CMc interposed. Since the sidewall barrier film 11c comprises the insulating film having the diffusion barrier function or the moisture absorption barrier function, even when a break exists in the cap metallic film CM covering the side surface of the redistribution line RM, it is possible to: prevent moisture and the like from intruding into the redistribution line RM from the exterior or prevent the copper film configuring the redistribution line RM from ionizing and migrating (diffusing) to the exterior; and improve the reliability of the semiconductor device having the redistribution line. It is therefore possible to: prevent withstand voltage deterioration or short circuit between adjacent redistribution lines RM; and improve the reliability of the semiconductor device having the redistribution line.

Further, since the base metallic film UMc is in contact with the cap metallic film CMc at the flared section PP that is the outside of the redistribution line RM, it is possible to prevent moisture and the like from intruding into the redistribution line RM from the exterior or prevent the copper film configuring the redistribution line RM from ionizing and migrating (diffusing) to the exterior.

Furthermore, since the cap metallic film CMc covering the side surface of the redistribution line RM is covered with the sidewall barrier film 11c having the moisture absorption barrier function, it is possible to prevent an etching liquid from intruding and thus prevent the copper film configuring the redistribution line RM from oxidizing when the second cap barrier film CM2c is wet-etched.

(Embodiment 4)

Embodiment 4 is a modified example of Embodiment 3 and the structure and manufacturing method of a cap metallic film CMd and the point that a recess exists at the upper surface of a surface protective film 10 are different from Embodiment 3. The explanations are made by using a different code to a part different from Embodiment 3. A part identical to Embodiment 3 is represented by an identical code. A semiconductor chip 1D is used in Embodiment 4 in order to be distinguished from Embodiment 3.

Figure 20:
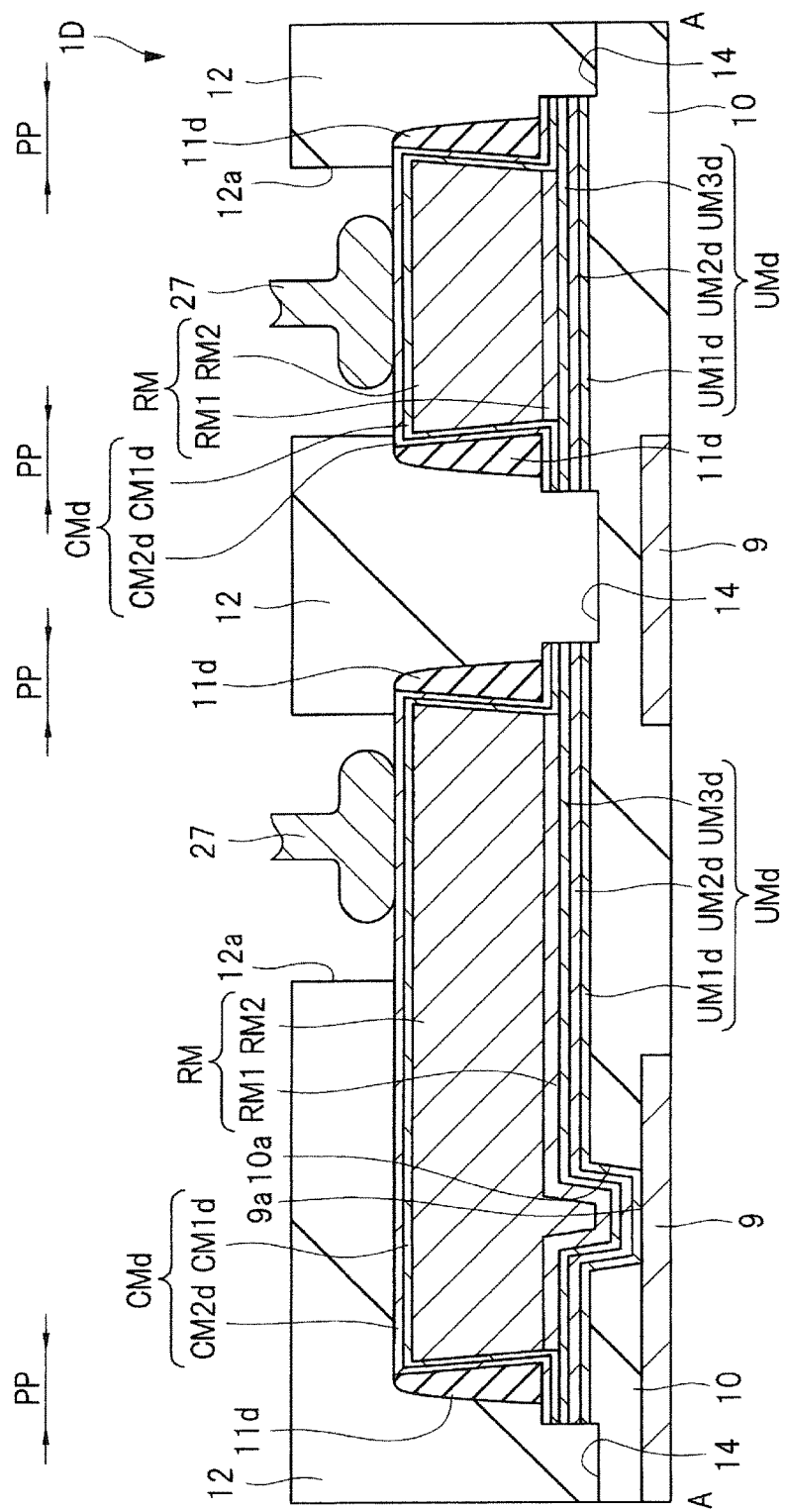
FIG. 20 is a sectional view of a semiconductor device according to Embodiment 4.

FIG. 20 is a sectional view of a semiconductor device according to Embodiment 4. FIG. 20 corresponds to the section taken on line A-A of FIG. 3. In the semiconductor device according to Embodiment 4, the upper surface and side surface of a redistribution line RM are covered with a cap metallic film CMd and a sidewall barrier film 11d is formed over the side surface of the redistribution line RM so as to cover the cap metallic film CMd. Unlike Embodiment 3, the cap metallic film CMd has a double-layered structure of a first cap barrier film CM1d and a second cap barrier film CM2d. Further, a recess 14 is formed at the upper surface of a surface protective film 10 located between adjacent redistribution lines RM. The recess 14 is formed between adjacent redistribution lines RM, in other words between the flared sections PP of adjacent redistribution lines RM, namely in the region exposed through the redistribution lines RM and the flared sections PP.

Figure 21:
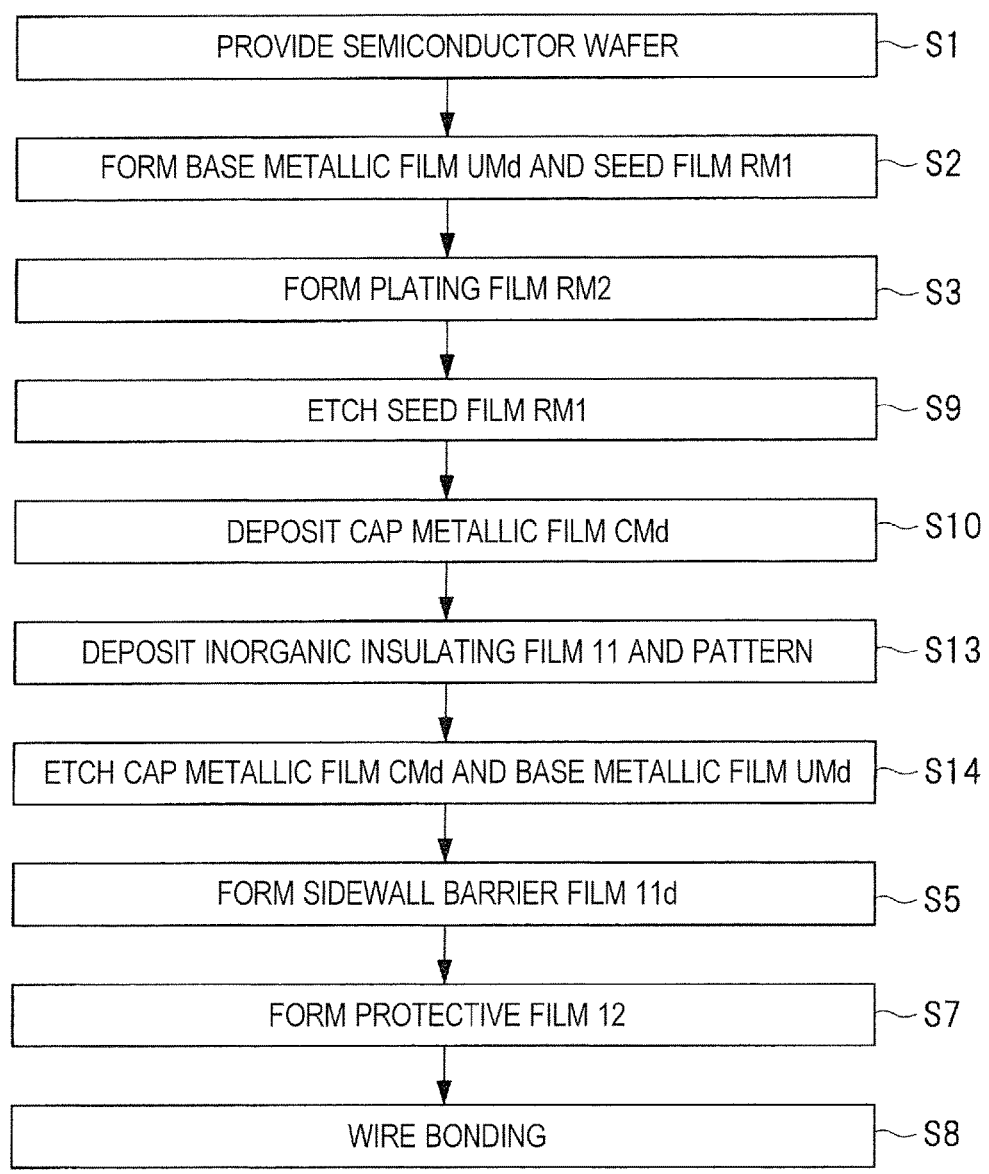
FIG. 21 is a process flow diagram showing a part of the manufacturing process of a semiconductor device according to Embodiment 4.
Figure 22:
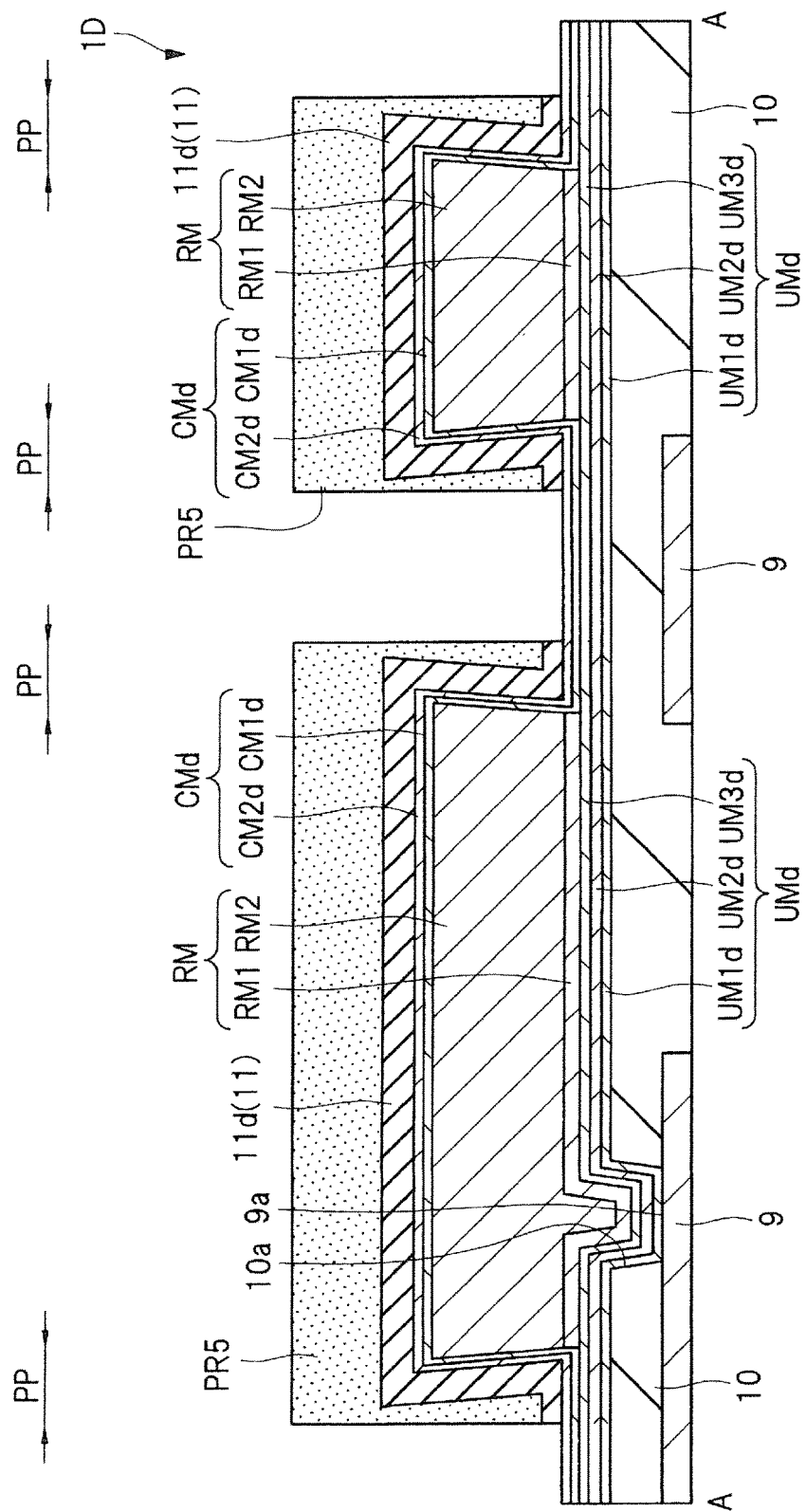
FIG. 22 is a sectional view of a semiconductor device according to Embodiment 4 during a manufacturing process.
Figure 23:
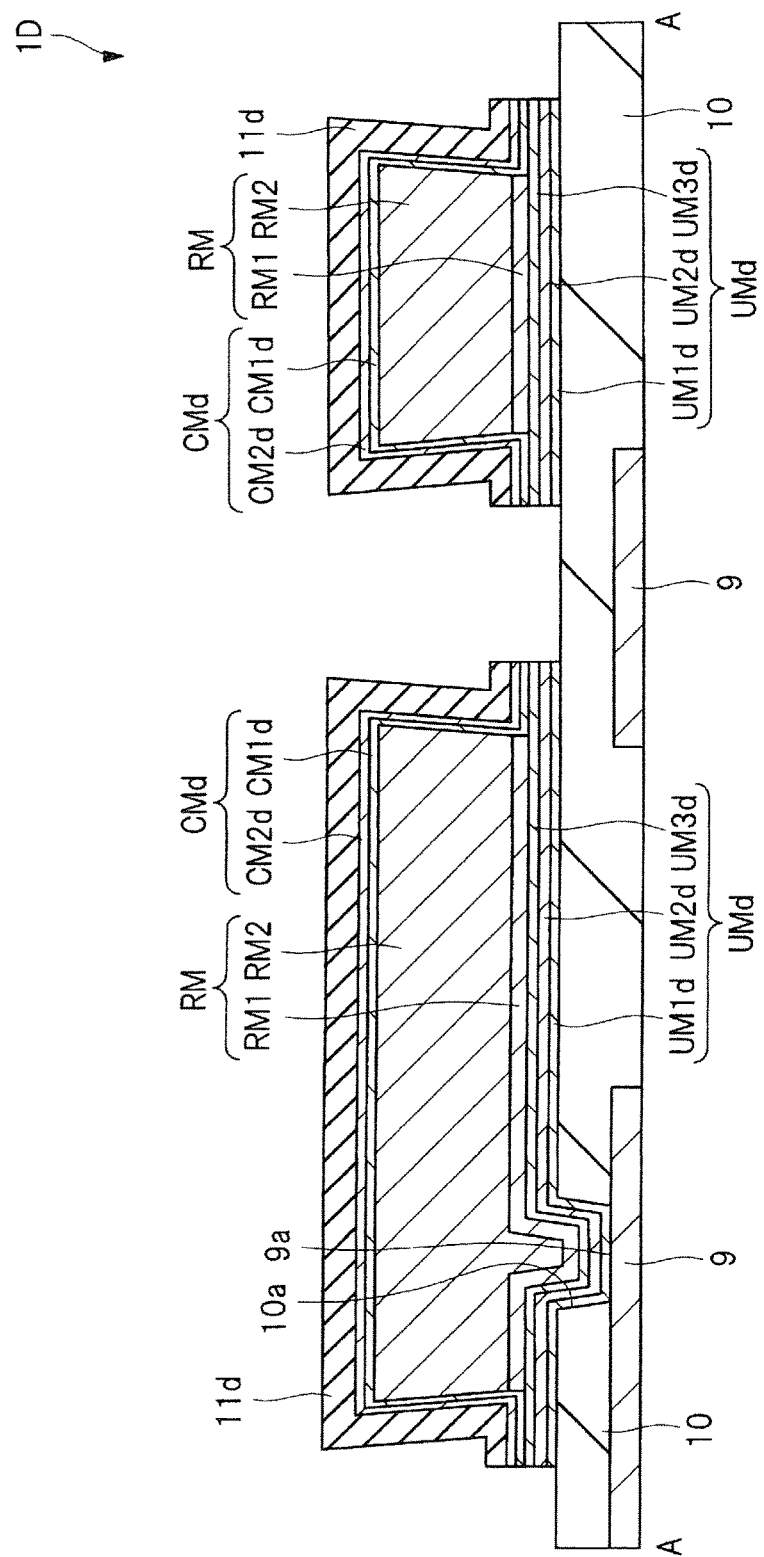
FIG. 23 is a sectional view of the semiconductor device during a manufacturing process subsequent to FIG. 22.

FIG. 21 is a process flow diagram showing a part of the manufacturing process of a semiconductor device according to Embodiment 4. FIGS. 22 and 23 are sectional views of the semiconductor device according to Embodiment 4 during the manufacturing process.

The processes (S1 to S3, S9, and S10) in the process flow diagram shown in FIG. 16 of Embodiment 3 are applied. Unlike Embodiment 3 however, the cap metallic film CMd has the double-layered structure of the first cap barrier film CM1d and the second cap barrier film CM2d. The first cap barrier film CM1d and the second cap barrier film CM2d are the same films as the first cap barrier film CM1c and the second cap barrier film CM2c of Embodiment 3 including the manufacturing methods. The first cap barrier film CM1d and the second cap barrier film CM2d are formed by a sputtering method.

FIG. 22 corresponds to the "inorganic insulating film 11 depositing and patterning" process (S13) in the process flow diagram shown in FIG. 21. An inorganic insulating film 11 comprising a silicon nitride film is formed so as to cover the cap metallic film CMd by a CVD method. Successively, a resist mask PR5 having the second plane pattern P2 in FIG. 3 is formed over the inorganic insulating film 11, the inorganic insulating film 11 in the region exposed through the resist mask PR5 is removed, and thus the patterned sidewall barrier film 11d is formed.

FIG. 23 corresponds to the "cap metallic film CMd and base metallic film UMd etching" process (S14) in the process flow diagram shown in FIG. 21. After the resist mask PR5 is removed, wet etching is applied to the second cap barrier film CM2d with the patterned sidewall barrier film 11d used as a mask and the second cap barrier film CM2d in the region exposed through the patterned sidewall barrier film 11d is removed. A potassium iodide solution is used for the wet etching in the same manner as Embodiment 3. On this occasion, since the upper surface and side surface of the redistribution line RM are covered with the patterned sidewall barrier film 11d and the lower surface of the redistribution line RM is covered with a base metallic film UMd, the copper film configuring the redistribution line RM never corrodes by the wet etching liquid.

Successively, anisotropic dry etching is applied to the base metallic film UMd with the patterned sidewall barrier film 11d used as a hard mask and the base metallic film UMd on the outside of the redistribution line RM and the flared section PP is removed. Here, since the patterned sidewall barrier film 11d is used as a hard mask in the anisotropic dry etching, the patterned sidewall barrier film 11d is formed so as to have a sufficiently large film thickness. That is, when the etching of the base metallic film UMd is completed, the patterned sidewall barrier film 11d that has been a hard mask remains over the upper surface of the redistribution line RM. In this way, the cap metallic film CMd and the base metallic film UMd, those having the second plane pattern P2, are formed. Here a wet etching method may be used for the processing of the base metallic film UMd and a mixed liquid of ammonia, a hydrogen peroxide solution, and water is suitable as the etching liquid on that occasion.

Successively, as shown in FIG. 20, the "sidewall barrier film 11d forming" process (S5) in the process flow diagram shown in FIG. 21 is applied and the sidewall barrier film 11d of a sidewall shape that is the final shape is formed. That is, anisotropic dry etching is applied to the patterned sidewall barrier film 11d, the sidewall barrier film 11d over the upper surface of the redistribution line RM is removed, and the cap metallic film CMd (accurately the second cap barrier film CM2d) is exposed. On this occasion, the sidewall barrier film 11d of a sidewall shape (nearly a triangle in cross section) is formed over the side surface of the redistribution line RM and further the recess 14 is formed at the surface of the surface protective film 10.

Successively, the processes (S7 and S8) in the process flow diagram shown in FIG. 21 are applied and the semiconductor device shown in FIG. 20 is completed.

The Major features of the semiconductor device according to Embodiment 4 are explained hereunder.

By forming the recess 14 at the surface of the surface protective film 10 between adjacent redistribution lines RM, it is possible to: increase the leak path of the copper ions between the redistribution lines RM; and reduce withstand voltage deterioration or short circuit between adjacent redistribution lines RM.

The dimension controllability improves because the base metallic film UMd is formed by dry etching.

Although the invention established by the present inventors has heretofore been explained concretely on the basis of the embodiments, it goes without saying that the present invention is not limited to the embodiments and can be modified variously within the scope not departing from the tenor of the present invention.

Although the explanations have been made on the basis of the examples of configuring the cap metallic film CM by the first cap barrier film CM1 and the second cap barrier film CM2 in Embodiments 1 to 4, the cap metallic film CM may comprise a single layer of the first cap barrier film CM1 that is a barrier film from the viewpoint of being able to prevent withstand voltage deterioration or short circuit between adjacent redistribution lines RM and improving the reliability of the semiconductor device having the redistribution line. Likewise, the base metallic film UM may also comprise a single layer.

Although the explanations have been made on the basis of the case where the side surface of the redistribution line is inversely tapered in Embodiments 1 to 4, the present invention is applicable to the case where the side surface of the redistribution line is forwardly tapered.

Although the explanations have been made on the basis of the examples of coupling the wire to the external pad electrode, the case of coupling a solder bump is also included for example.

What is claimed is:

1. A semiconductor device comprising:
   a semiconductor substrate;
   a plurality of wiring layers formed over the semiconductor substrate;
   a first pad electrode formed at the uppermost layer of the wiring layers;
   a protective film having an opening over the pad electrode;
   a base metallic film formed over the protective film and the pad electrode;
   a redistribution line formed over the base metallic film and having an upper surface and a side surface;
   a sidewall barrier film comprised of an insulating film covering the side surface of the redistribution line; and
   a cap metallic film covering the upper surface of the redistribution line,
   wherein the upper surface and the side surface of the redistribution line are covered with the cap metallic film or the sidewall barrier film and the cap metallic film and the sidewall barrier film have an overlapping section, and
   wherein a protective film over the redistribution line has an opening over the redistribution line to configure a second pad electrode that does not overlap with the first pad electrode.

2. A semiconductor device according to claim 1, wherein the sidewall barrier film covers the sidewall of the base metallic film and is in contact with the protective film.

3. A semiconductor device according to claim 1, wherein the cap metallic film is formed continuously from the upper surface to the side surface and covers the sidewall barrier film over the side surface.

4. A semiconductor device according to claim 1, wherein the cap metallic film is formed continuously from the upper surface to the side surface and the sidewall barrier film covers the cap metallic film over the side surface.

5. A semiconductor device according to claim 1, wherein the redistribution line has a lower surface facing the upper surface and the width of the redistribution line on the upper surface side is larger than the width of the redistribution line on the lower surface side.

6. A semiconductor device according to claim 1, wherein the sidewall barrier film comprises a silicon nitride film or a silicon oxide film.

7. A semiconductor device according to claim 1, wherein the redistribution line comprises a copper film.

8. A semiconductor device according to claim 7, wherein the cap metallic film includes a titanium film, a tantalum film, a tungsten film, a nickel film, a titanium nitride film, a tantalum nitride film, a tungsten nitride film, or a nickel nitride film, which is in contact with the redistribution line.

9. A semiconductor device according to claim 1, wherein the protective film and the sidewall barrier film comprise silicon nitride films.

* * * * *